United States Patent
Cheng

(10) Patent No.: US 9,761,596 B2
(45) Date of Patent: Sep. 12, 2017

(54) NON-VOLATILE MEMORY AND MANUFACTURING METHOD THEREOF

(71) Applicants: IoTMemory Technology Inc., Taipei (TW); Yu-Ming Cheng, Taipei (TW)

(72) Inventor: Yu-Ming Cheng, Taipei (TW)

(73) Assignees: IoTMemory Technology Inc., Taipei (TW); Yu-Ming Cheng, Taipei (TW)

( * ) Notice: Subject to any disclaimer, the term of this patent is extended or adjusted under 35 U.S.C. 154(b) by 32 days.

(21) Appl. No.: 14/612,191

(22) Filed: Feb. 2, 2015

(65) Prior Publication Data

US 2016/0225777 A1    Aug. 4, 2016

(51) Int. Cl.
*H01L 27/115* (2017.01)
*H01L 29/788* (2006.01)
*H01L 29/66* (2006.01)
*H01L 21/28* (2006.01)
*H01L 29/423* (2006.01)
*H01L 27/11521* (2017.01)

(52) U.S. Cl.
CPC .. *H01L 27/11521* (2013.01); *H01L 21/28273* (2013.01); *H01L 29/42328* (2013.01); *H01L 29/66825* (2013.01); *H01L 29/7885* (2013.01)

(58) Field of Classification Search
CPC ......... H01L 27/11521; H01L 21/28273; H01L 21/32133; H01L 29/51; H01L 29/511; H01L 29/518; H01L 29/6656; H01L 29/66825; H01L 29/7883; H01L 29/42328; H01L 29/42364
See application file for complete search history.

(56) References Cited

U.S. PATENT DOCUMENTS

| 5,338,952 A | 8/1994 | Yamauchi |
| 6,504,762 B1 * | 1/2003 | Harari ................. G11C 11/5621 |
| | | 257/E21.209 |
| 6,621,115 B2 * | 9/2003 | Jenq ................... H01L 27/11521 |
| | | 257/314 |
| 2003/0087493 A1 * | 5/2003 | Jenq ................... H01L 27/11521 |
| | | 438/265 |
| 2005/0036393 A1 * | 2/2005 | Jenq ................... H01L 21/28273 |
| | | 365/232 |
| 2014/0264539 A1 | 9/2014 | Do et al. |
| 2015/0008451 A1 * | 1/2015 | Su .................... H01L 21/823425 |
| | | 257/77 |

* cited by examiner

*Primary Examiner* — Cheung Lee
*Assistant Examiner* — Stephen C Smith
(74) *Attorney, Agent, or Firm* — Jianq Chyun IP Office

(57) ABSTRACT

A non-volatile memory having memory cells is provided. The memory cells include stack structures, floating gates, tunneling dielectric layers, erase gate dielectric layers, auxiliary gate dielectric layers, source regions, drain regions, control gates and inter-gate dielectric layers. The stacked structures include gate dielectric layers, auxiliary gates, insulating layers and erase gates. The floating gates are disposed on sidewalls on a first side of the stacked structures. The tunneling dielectric layers are disposed under the floating gates. The erase gate dielectric layers are disposed between the erase gates and floating gates. The auxiliary gate dielectric layers are disposed between the auxiliary gates and the floating gates. The source and drain regions are separately disposed on sides of the stack structures and the floating gates. The control gates are disposed on the source regions and the floating gates. The inter-gate dielectric layers are disposed between the control gates and the floating gates.

15 Claims, 22 Drawing Sheets

NON-VOLATILE MEMORY AND MANUFACTURING METHOD THEREOF

BACKGROUND OF THE INVENTION

1. Field of the Invention

The invention relates to a semiconductor device and a manufacturing method thereof. More particularly, the invention relates to a non-volatile memory and a manufacturing method thereof.

2. Description of Related Art

Since operations such as data programming, reading, and erasing to non-volatile memories for multiple times, and the non-volatile memories have the advantage that data stored therein do not disappear after the power is turned off, the non-volatile memories have been broadly used in personal computer and electronic apparatuses.

The conventional non-volatile memory is designed to have a stack gate structure including a tunneling oxidation layer, a floating gate, an inter-gate dielectric layer, and a control gate that are sequentially disposed on a substrate. When pertaining a programming or erasing operation to the flash memory device, appropriate voltages are respectively applied to a source region, a drain region, and the control gate, such that electrons are injected into a polysilicon floating gate or pulled out from the polysilicon floating gate.

Usually, in an operation of the non-volatile memory, if a gate-coupling ratio (GCR) between the floating gate and the control gate is greater, an operational voltage required becomes lower, and an operational speed and efficiency of the flash memory thus increase significantly. The GCR may be increased by increasing an overlapped area between the floating gate and the control gate, decreasing a thickness of a dielectric layer between the floating gate and the control gate, and increasing a dielectric constant (i.e., k) of an inter-gate dielectric layer between the floating gate and the control gate, etc.

However, as integrated circuits are developed toward a miniaturized device with a higher integrity, the size of memory cells of the non-volatile memories needs to be reduced to increase the integrity. The size of memory cells may be reduced by reducing a gate length of the memory cell and separation of bit lines. However, reducing the gate length also reduces the length of a channel below the tunneling oxidation layer, which may easily induce an undesired electrical punch through between the drain region and the source region and consequently influence the performance of the memory cell. Besides, when programming or erasing the memory cells, the electrons may repetitively pass through the tunneling oxidation layer, resulting in the decreasing of quality of the tunneling oxidation layer and consequently reducing the reliability of the memory device.

SUMMARY OF THE INVENTION

The invention provides a non-volatile memory and a manufacturing method thereof capable of reducing an operational voltage to operate, thereby increasing a reliability of a semiconductor device.

The invention provides a non-volatile memory and a manufacturing method thereof capable of increasing an integrity of a device.

The invention provides a non-volatile memory having a first memory cell disposed on a substrate. The first memory cell includes a stack structure, a floating gate, a tunneling dielectric layer, an erase gate dielectric layer, an auxiliary gate dielectric layer, a source region, a drain region, a control gate and an inter-gate dielectric layer. In addition, the stack structure includes a gate dielectric layer, an auxiliary gate, an insulating layer, and an erase gate sequentially disposed on the substrate. The floating gate is disposed on a sidewall on a first side of the stack structure. A top portion of the floating gate has a corner portion, the corner portion is adjacent to the erase gate, and a height of the corner portion falls within a range of a height of the erase gate. The tunneling dielectric layer is disposed between the floating gate and the substrate. The erase gate dielectric layer is disposed between the erase gate and the floating gate. The auxiliary gate dielectric layer is disposed between the auxiliary gate and the floating gate. The source region and the drain region are respectively disposed in the substrate at sides of the stack structure and the floating gate. In addition, the source region is adjacent to the floating gate, the drain region is adjacent to a second side of the stack structure, and the first side is opposite to the second side. The control gate is disposed on the source region and the floating gate. The inter-gate dielectric layer is disposed between the control gate and the floating gate.

According to an embodiment of the invention, the non-volatile memory further includes a second memory cell. The second memory cell is disposed on the substrate. In addition, a structure of the second memory cell is the same as a structure of the first memory cell, and the second memory cell and the first memory cell are disposed in a mirror arrangement and share the source region or the drain region.

According to an embodiment of the invention, the first memory cell and the second memory cell share the control gate, and the control gate fills an opening between the first memory cell and the second memory cell.

According to an embodiment of the invention, the non-volatile memory further includes a third memory cell. The third memory cell is disposed on the substrate. In addition, a structure of the third memory cell is the same as a structure of the first memory cell, the third memory cell and the first memory cell share the source region, the auxiliary gate, the erase gate, and the control gate, and the control gate fills between the first memory cell and the third memory cell.

According to an embodiment of the invention, the tunneling dielectric layer is disposed between the control gate and the source region.

According to an embodiment of the invention, the auxiliary dielectric layer is disposed between the floating gate and the auxiliary gate. A material of the auxiliary gate dielectric layer includes silicon oxide/silicon nitride, silicon oxide/silicon nitride/silicon oxide, or silicon oxide.

According to an embodiment of the invention, a material of the insulating layer includes silicon oxide. A material of the inter-gate dielectric layer includes silicon oxide/silicon nitride/silicon oxide, silicon nitride/silicon oxide, or other high dielectric constant (k>4) materials.

According to an embodiment of the invention, a material of the tunneling dielectric layer includes silicon oxide, and a thickness of the tunneling dielectric layer is in a range from 60 Å to 200 Å.

According to an embodiment of the invention, a material of the gate dielectric layer includes silicon oxide, and a thickness of the gate dielectric layer is less than or equal to a thickness of the tunneling dielectric layer. A material of the erase gate dielectric layer includes silicon oxide, and a thickness of the erase gate dielectric layer is in a range from 100 Å to 180 Å.

According to an embodiment of the invention, a top portion of the floating gate has a corner portion, and an angle of the corner portion is less than or equal to 90 degrees.

According to an embodiment of the invention, a width of the auxiliary gate is greater than a width of the erase gate, and a stepped profile is formed at the first side of the stack structure. The floating gate includes a first portion located at a sidewall of the auxiliary gate and a second portion located at a sidewall of the erase gate.

The invention provides a manufacturing method of a non-volatile memory including steps as follows. Firstly, a substrate is provided. At least two stack structures are formed on the substrate. Each of the stack structures includes a gate dielectric layer, an auxiliary gate, an insulating layer, and an erase gate sequentially formed on the substrate. Then, auxiliary gate dielectric layers are formed on sidewalls of the stack structures. Top portions of the auxiliary gate dielectric layers are located between the auxiliary gates and the erase gates. In addition, a tunneling dielectric layer is formed on the substrate between the stack structures. Then, erase gate dielectric layers are formed on the auxiliary gate dielectric layers, conductor spacers are formed on sidewalls of a first side of the stack structures, and a source region is formed in the substrate between the conductor spacers. Subsequently, the conductor spacers are patterned to form floating gates In addition, top portions of the floating gates have corner portions, the corner portions are adjacent to the erase gates, and a height of the corner portions falls within a range of a height of the erase gates. Afterwards, drain regions are formed in the substrate on a second side of the stack structures. In addition, the first side is opposite to the second side. Then, inter-gate dielectric layers are formed on the floating gates, and control gates are formed on the inter-gate dielectric layers.

According to an embodiment of the invention, a step of forming the auxiliary gate dielectric layer, the erase gate dielectric layer, and the conductor spacer includes the following. An isolating material layer is formed on the sidewall of the stack structure. A first conductor layer is formed at the tunneling dielectric layer. In addition, a top portion of the first conductor layer is located between the auxiliary gate and the erase gate. Then, a portion of the isolating material layer is removed to form an auxiliary gate dielectric layer. Afterwards, the erase gate dielectric layer is formed on the auxiliary gate dielectric layer, and a second conductor layer is formed on the first conductor layer. Subsequently, a portion of the second conductor layer and the first conductor layer are removed to form the conductor spacer.

According to an embodiment, the step of removing a portion of the second conductor layer and the first conductor layer to form the conductor spacer includes: performing an anisotropic etching process to the second conductor layer and the first conductor layer.

The invention provides a manufacturing method of a non-volatile memory including steps as follows. First of all, a substrate is provided. At least two auxiliary gate structures are formed on the substrate. In addition, each of the auxiliary gate structures includes a gate dielectric layer, an auxiliary gate, and an insulating layer sequentially formed on the substrate. Then, auxiliary gate dielectric layers are formed on sidewalls of the auxiliary gate structures, a tunneling dielectric layer is formed on the substrate between the auxiliary gate structures, and first conductor layers are formed on the substrate. Then, the first conductor layers are patterned to form an opening at least exposing the tunneling dielectric layer between the auxiliary gate structures, and first conductor spacers are formed on sidewalls on a first side of the auxiliary gate structures. Subsequently, erase gate dielectric layers are formed on sidewalls of the first conductor layers exposed by the opening, and second conductor spacers are formed on the first conductor spacers and sidewalls of the erase gate dielectric layers. Then, a portion of the first conductor layers is removed to form erase gates, and a source region is formed in the substrate between the first conductor spacers. Next, the first conductor spacers and second conductor spacers are patterned to form floating gates. In addition, top portions of the floating gates have corner portions, the corner portions are adjacent to the erase gates, and a height of the corner portions falls within a range of a height of the erase gates. Subsequently, drain regions in the substrate are formed on a second side of the auxiliary gate structures, and the first side is opposite to the second side. Inter-gate dielectric layers are formed on the floating gates, and control gates are formed on the inter-gate dielectric layers.

According to an embodiment of the invention, a width of the opening between the first conductor layers is greater than a width between the auxiliary gate structures.

In the non-volatile memory and the manufacturing method thereof of the invention, two adjacent memory cells in X direction (row direction) have the same structure and in a mirror arrangement, and share the source region or drain region and share the control gate. Two adjacent memory cells in Y direction (column direction) have the same structure and share the source region, the auxiliary gate (word line), the erase gate, and the control gate. In this way, an integrity of the device is increased.

In the non-volatile memory and the manufacturing method thereof of the invention, the auxiliary gate and the erase gate are disposed in parallel. Thus, the integrity of the device is increased.

In the non-volatile memory of the invention, the gate dielectric layer below the auxiliary gate has a thinner thickness. When operating the memory cells, the channel region below the auxiliary gate may be turned on/off by using a smaller voltage. Namely, the operational voltage is reduced.

In the non-volatile memory and the manufacturing method thereof of the invention, the control gate formed accordingly covers the floating gate, so as to increase an area included between the control gate and the floating gate, thereby increasing a coupling ratio of the memory device.

In the non-volatile memory and the manufacturing method thereof of the invention, since the corner portion is disposed in the floating gate within the height of the erase gate, and an angle of the corner portion is less than or equal to 90 degrees, by concentrating an electrical field by using the corner portion, the erase voltage may be reduced to effectively pull out electrons from the floating gate and increase the speed of erasing data.

To make the aforementioned and other features and advantages of the invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
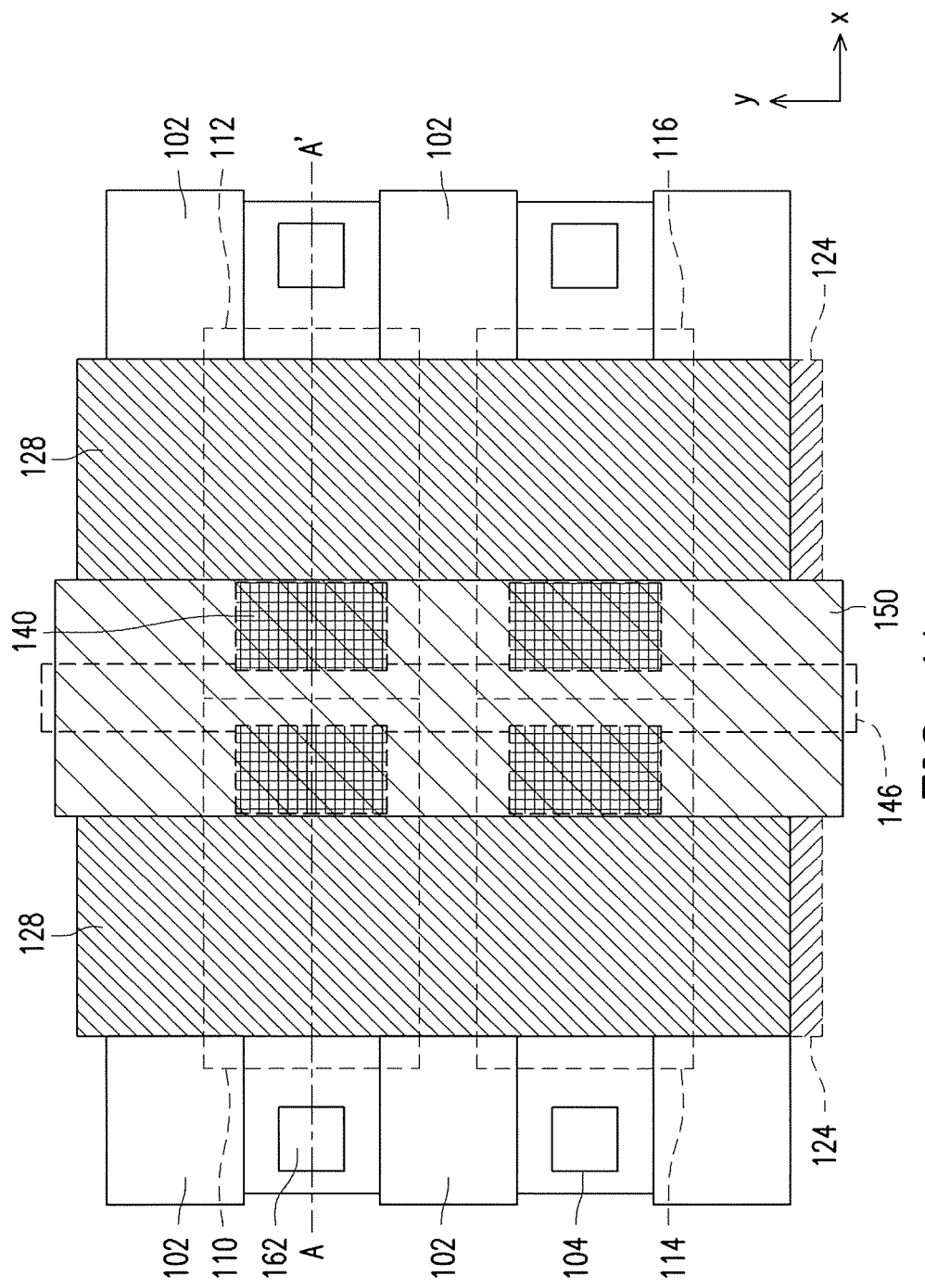
FIG. 1A is a top view illustrating a non-volatile memory according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

Figure 1B:
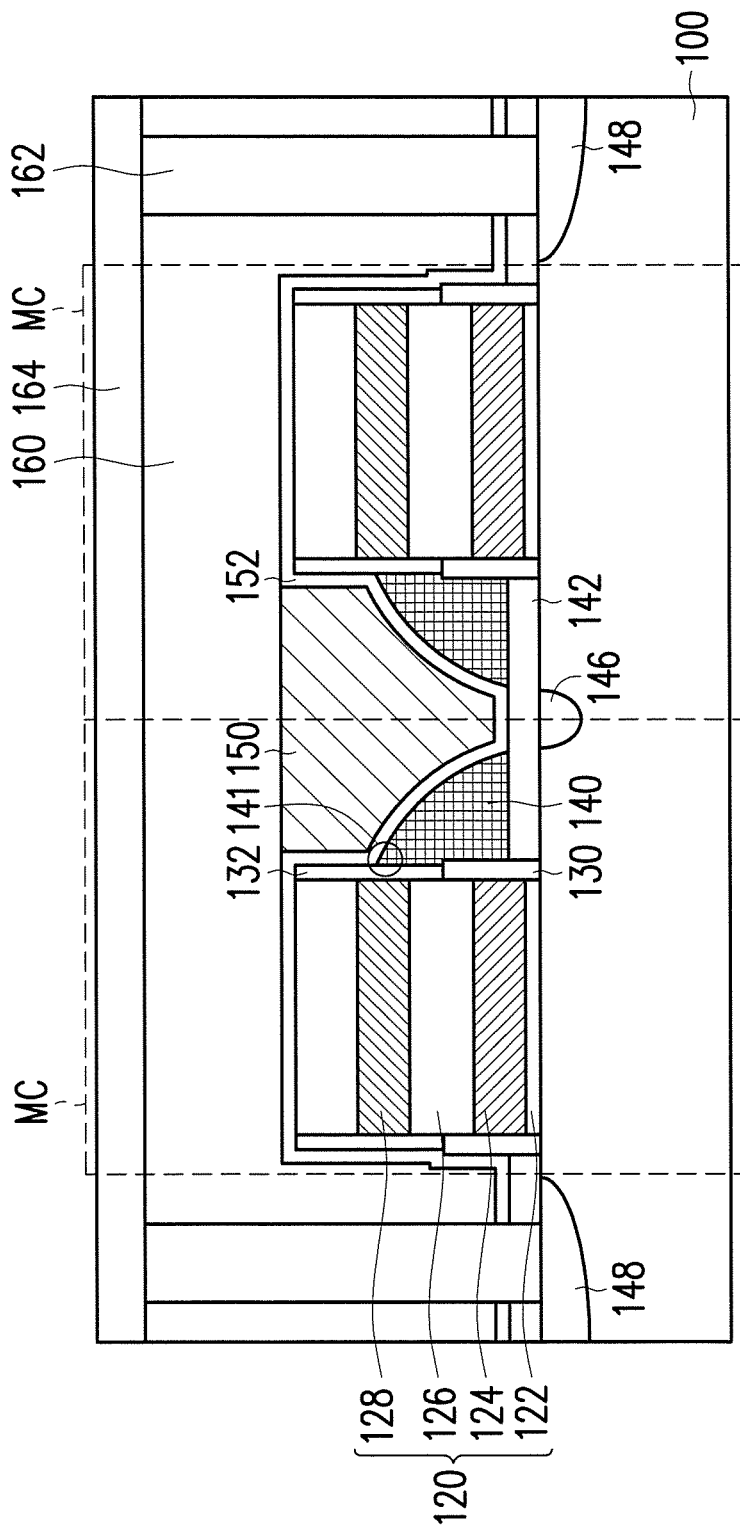
FIG. 1B is a cross-sectional schematic view illustrating a non-volatile memory according to an embodiment of the invention.
Figure 1C:
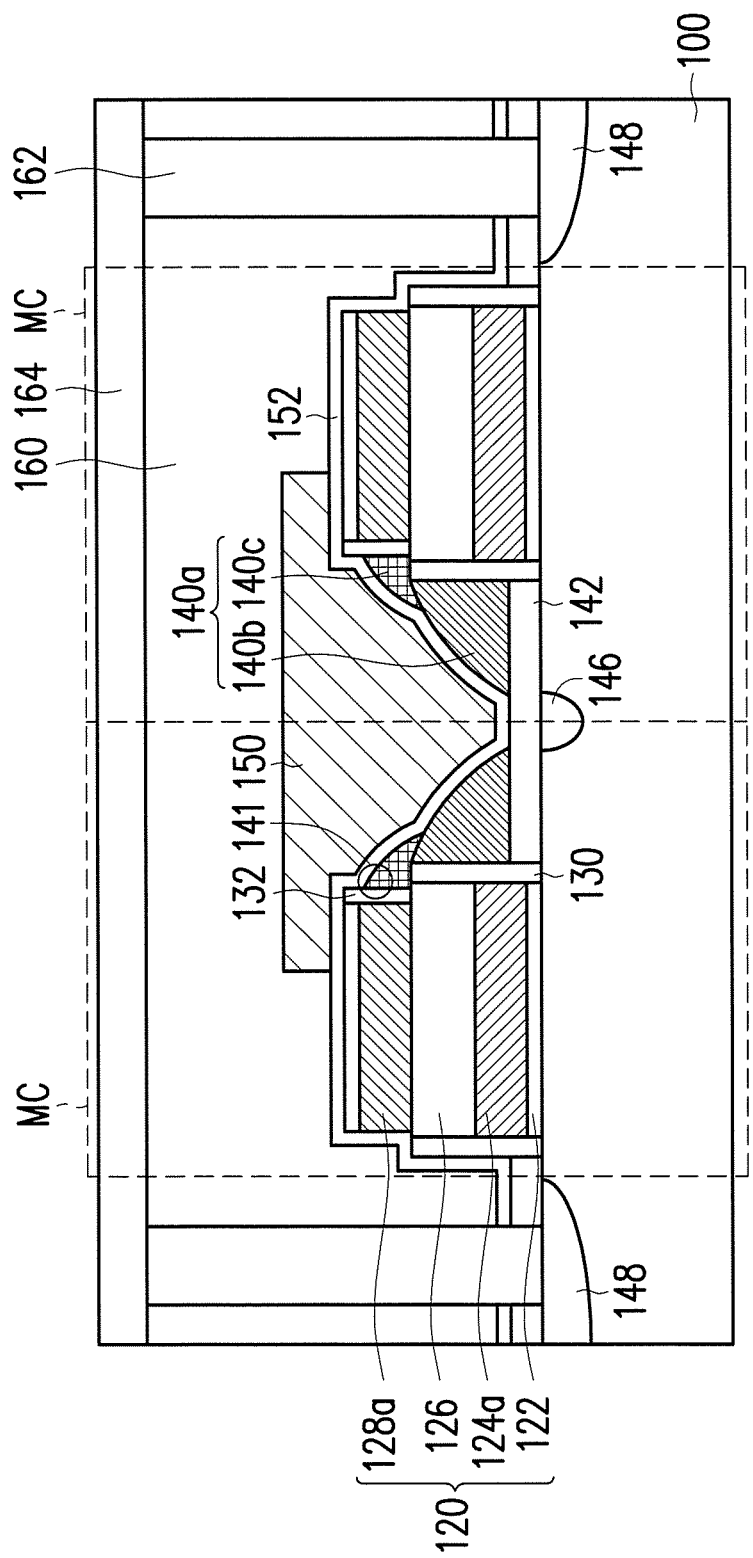
FIG. 1C is a cross-sectional schematic view illustrating a non-volatile memory according to another embodiment of the invention.

FIG. 1A is a top view illustrating a non-volatile memory according to an embodiment of the invention. FIG. 1B is a cross-sectional schematic view illustrating a non-volatile memory according to an embodiment of the invention. FIG. 1B is a cross-sectional view taken along a line A-A' shown in FIG. 1A. FIG. 1C is a cross-sectional schematic view illustrating a non-volatile memory according to another embodiment of the invention.

Referring to FIGS. 1A and 1B, the non-volatile memory includes a plurality of memory cells MC. The memory cells MC are arranged to form a column/row array.

The non-volatile memory is disposed on a substrate 100. In the substrate 100, a plurality of isolation structures 102, for example, are arranged regularly to define a lattice-like active area 104. The isolation structures 102 are shallow trench isolation structures, for example.

Each of the memory cells MC includes a stack structure 120, an auxiliary gate dielectric layer 130, an erase gate dielectric layer 132, a floating gate 140, a tunneling dielectric layer 142, a source region 146, a drain region 148, a control gate 150, and an inter-gate dielectric layer 152. In addition, an interlayer insulating layer 160, a plug 162, and a bit line 164 are also disposed on the substrate 100.

The stack structure 120 includes a gate dielectric layer 122, an auxiliary gate (word line) 124, an insulating layer 126, and an erase gate 128 sequentially disposed on the substrate 100. The gate dielectric layer 122 is disposed between the auxiliary gate 124 and the substrate 100, for example. A material of the gate dielectric layer 122 is silicon oxide, for example. A thickness of the gate dielectric layer 122 is smaller than or equal to a thickness of the tunneling dielectric layer 142, for example.

The auxiliary gate 124 is disposed between the gate dielectric layer 122 and the insulating layer 126, for example. The erase gate 128 is disposed on the insulating layer 126, for example. The auxiliary gate 124 and the erase gate 128 extend along Y direction, for example. Materials of the auxiliary gate 124 and the erase gate 128 include conductor materials, such as doped polysilicon. The insulating layer 126 is disposed between the auxiliary gate 124 and the erase gate 128, for example. A material of the insulating layer 126 includes silicon oxide, for example.

The auxiliary gate dielectric layer 130 is disposed between the floating gate 140 and the auxiliary gate 124, for example. A material of the auxiliary gate dielectric layer 130 includes silicon oxide/silicon nitride/silicon oxide or silicon nitride/silicon oxide, for example. A thickness of the auxiliary gate dielectric layer 130 is greater than or equal to a thickness of the erase gate dielectric layer 132, for example. The erase gate dielectric layer 132 is disposed between the erase gate 128 and the floating gate 140, for example. A material of the erase gate dielectric layer 132 includes silicon oxide, for example. The thickness of the erase gate dielectric layer 132 is in a range from 100 Å to 180 Å, for example.

The floating gate 140 is disposed at a sidewall on a first side of the stack structure 120, for example. In addition, a top portion of the floating gate 140 has a corner portion 141. The top portion 141 is adjacent to the erase gate 128. In addition, a height of the corner portion falls within a range of a height of the erase gate 128. An angle of the corner portion 141 is less than or equal to 90 degrees. A material of the floating gate 140 includes a conductor material, such as doped polysilicon. The floating gate 140 may be formed by one or more conductor layers.

The tunneling dielectric layer 142 is disposed between the floating gate 140 and the substrate 100, for example. The tunneling dielectric layer 142 is disposed between the control gate 150 and the source region 146, for example. Moreover, a material of the tunneling dielectric layer 142 includes silicon oxide, for example. The thickness of the tunneling dielectric layer 142 is in a range from 60 Å to 200 Å.

The source region 146 is disposed in the substrate 100 beside the floating gate 140. The drain region 148 is disposed in the substrate 100 on a second side of the stack structure 120. In addition, the first side is opposite to the second side. The source region 146 and the drain region 148 may be doped regions containing an N-type or P-type dopant, for example, depending on a design of the device.

The control gate 150 is disposed on the source region 146 and the floating gate 140, for example. The control gate 150 extends along Y direction (column direction), for example. A material of the control gate 150 includes a conductor material, such as doped polysilicon. The inter-gate dielectric layer 152 is disposed between the control gate 150 and the floating gate 140, for example. A material of the inter-gate dielectric layer 152 is silicon oxide/silicon nitride/silicon oxide, silicon nitride/silicon oxide or other high dielectric constant (e.g., k>4) materials, for example.

The interlayer insulating layer 160 is disposed on the substrate 100, for example, and covers a first memory cell 110 and a second memory cell 112. A material of the interlayer insulating layer 160 includes silicon oxide, phosphorosilicate glass, boron-phosphorosilicate glass, or other suitable dielectric materials, for example. The plug 162 is disposed in the interlayer insulating layer 160, and the plug 162 is electrically connected with the drain region 148. A material of the plug 162 is a conductor material such as aluminum, tungsten, etc. The bit line 164 is disposed on the interlayer insulating layer 160, for example, and the bit line 164 is electrically connected with the drain region 148 through the plug 162. A material of the bit line 164 is a conductor material such as aluminum, tungsten, copper, etc.

In X direction (row direction), the memory cells MC are serially connected through the source region 146 or the drain region 148. For example, a structure of the memory cell 110 is the same as a structure of the memory cell 112, and the memory cells 110 and 112 are in a mirror arrangement and share the source region 146 or the drain region 148. A structure of a memory cell 114 is the same as a structure of a memory cell 116, and the memory cells 114 and 116 are in a mirror arrangement and share the source region 146 or the drain region 148. In addition, the memory cells 110 and 112 share the control gate 150, and the control gate 150 fills between the memory cells 110 and 112. The memory cells 114 and 116 also share the control gate 150, and the control gate 150 fills between the memory cells 114 and 116.

In Y direction (column direction), the memory cells MC are serially connected through the source region 146, the auxiliary gate (word line) 124, the erase gate 128, and the control gate 150. In other words, in the column direction, the memory cells MC share the same source region 146, auxiliary gate (word line) 124, erase gate 128, and control gate 150. For example, the structure of the memory cell 110 is the same as the structure of the memory cell 114, the structure of the memory cell 112 is the same as the structure of the memory cell 116, and the control gate 150 fills between the memory cell 110 and 114 as well as the memory cell 112 and the memory cell 116. The memory cell 114 and the first memory cell 110 in the same column share the same source region 146, auxiliary gate (word line) 124, erase gate 128, and control gate 150.

FIG. 1C is a cross-sectional schematic view illustrating a non-volatile memory according to another embodiment of the invention. In FIG. 1C, the same reference numbers are used to refer to the same components in FIG. 1B, and description of the same components are not repeated.

As shown in FIG. 1C, a width of the auxiliary gate 124a is greater than a width of the erase gate 128a. Thus, a stepped profile is formed on the first side of the stack structure 120. A floating gate 140a includes a first portion 140b located at a sidewall of the auxiliary gate 124a and a second portion 140c located at a sidewall of the erase gate 128a.

In the non-volatile memory, two adjacent memory cells MC in X direction (row direction) have the same structure. Also, two adjacent memory cells MC in X direction (row direction) are disposed in a mirror arrangement, share the source region 146 or the drain region 148, and share the control gate 150, for example. Two adjacent memory cells MC in Y direction (column direction) have the same structure, and share the source region 146, the auxiliary gate (word line) 124 (124a), the erase gate 128(128a), and the control gate 150. In this way, an integrity of the device may be increased.

In the non-volatile memory, the auxiliary gate and the erase gate are arranged as a stack structure to increase the integrity of the device.

In the non-volatile memory, the gate dielectric layer 122 has a thinner thickness. When operating the memory cells, a channel region below the auxiliary gate 124 (124a) may be turned on/off by using a smaller voltage. Namely, an operational voltage is reduced. The control gate 150 covers the floating gate 140 (140a), so as to increase an area included between the control gate 150 and the floating gate 140 (140a), thereby increasing a coupling ratio of the memory device. Since the corner portion 141 is disposed in the floating gate 140 (140a) within the height of the erase gate 128 (128a), and the angle of the corner portion 141 is less than or equal to 90 degrees, by concentrating an electrical field by using the corner portion 141, an erase voltage may be reduced to effectively pull out electrons from the floating gate 140 (140a) and increase a speed of erasing data.

FIGS. 2A to 2H are cross-sectional schematic views illustrating a manufacturing method of a non-volatile memory according to an embodiment of the invention.

Figure 2A:
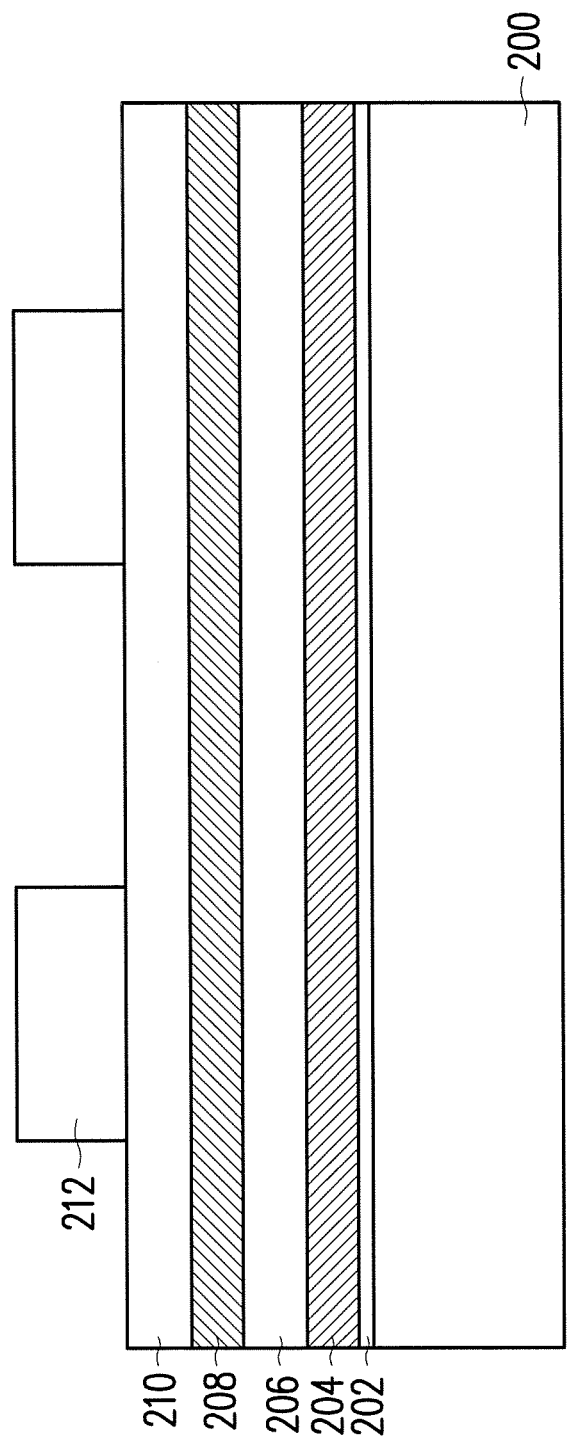
FIGS. 2A to 2H are cross-sectional schematic views illustrating a manufacturing method of a non-volatile memory according to an embodiment of the invention.

First, as shown in FIG. 2A, a substrate 200 is provided. A dielectric layer 202, a conductor layer 204, a dielectric layer 206, a conductor layer 208, and a dielectric layer 210 are sequentially formed on the substrate 200. A material of the dielectric layer 202 includes silicon oxide, for example, and a method of forming the dielectric layer 202 includes performing a thermal oxidation process, for example. Materials of the conductor layer 204 and the conductor layer 208 include doped polysilicon or polysilicides, etc., for example. When the materials of the conductor layer 204 and the conductor layer 208 are doped polysilicon, a method of forming the conductor layer 204 and the conductor layer 208 includes forming an undoped polysilicon layer by performing a chemical vapor deposition process and then performing an ion implantation process to form the conductor layer 204 and the conductor layer 208, or formed by implanting dopants in-situ by performing a chemical vapor deposition process to form the conductor layer 204 and the conductor layer 208, for example. Materials of the dielectric layer 206 and the dielectric layer 210 include silicon oxide or silicon nitride, for example, and the dielectric layer 206 and the dielectric layer 210 may be formed by performing a chemical vapor deposition process, for example.

Then, a patterned photoresist layer 212 is formed on the substrate 200. A method of forming the patterned photoresist layer 212 includes forming a photoresist material layer on the whole substrate 200 and then performing an exposure process and a development process to form the patterned photoresist layer 212, for example.

Figure 2B:
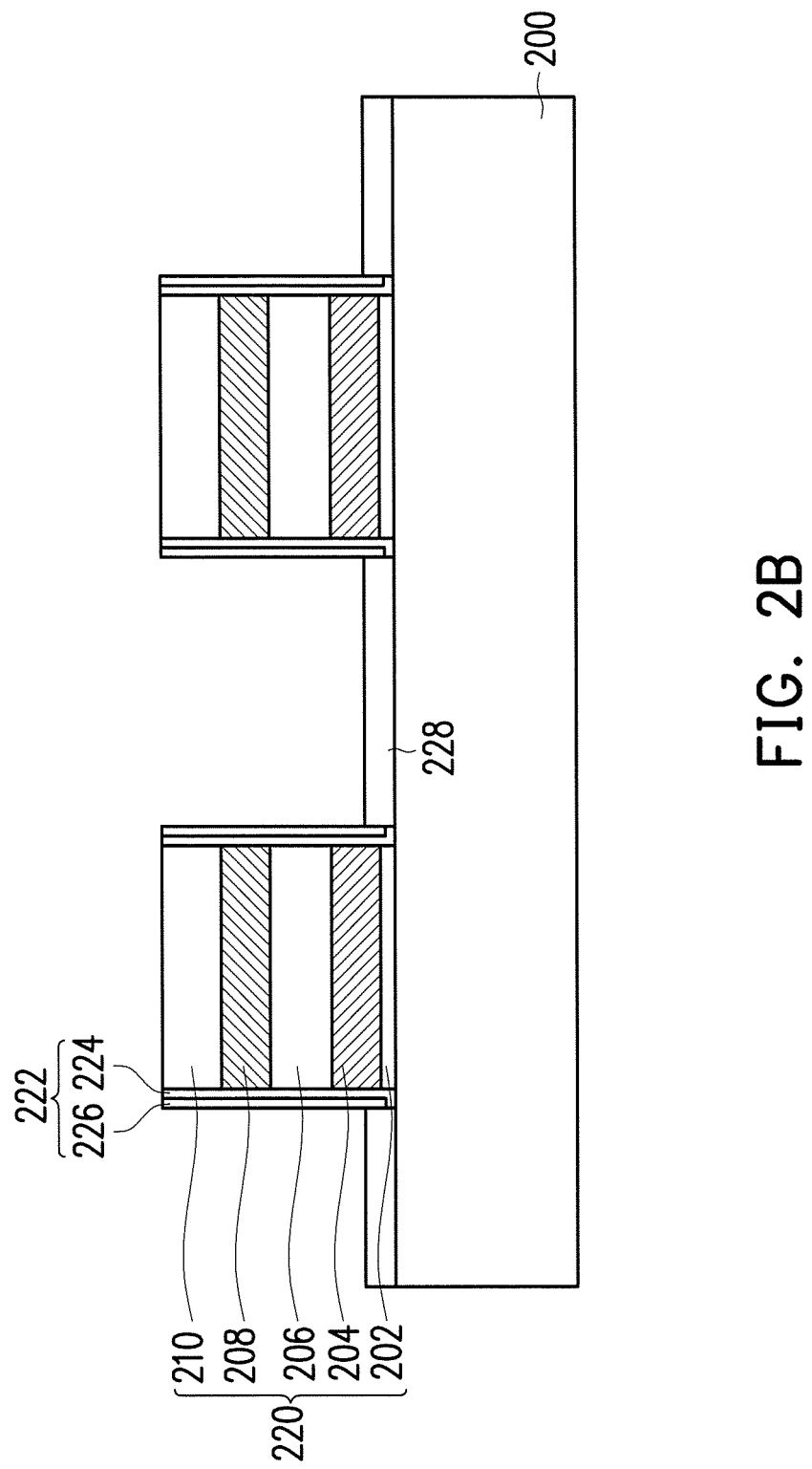

Referring to FIG. 2B, using the patterned photoresist layer 212 as a mask, a portion of the dielectric layer 210, the conductor layer 208, the dielectric layer 206, the conductor layer 204, and the dielectric layer 202 is removed to form at least two stack structures 220. Here, the dielectric layer 202 serves as a gate dielectric layer, the conductor layer 204 serves as an auxiliary gate (word line), the dielectric layer 206 serves as an insulating layer, the conductor layer 208 serves as an erase gate, and the dielectric layer 210 serves as a hardmask layer. Next, the patterned photoresist layer 212 is removed. A method of removing the patterned photoresist layer 212 includes performing a wet photoresist stripping process or a dry photoresist stripping process, for example.

Then, an isolating material layer 222 is formed on a sidewall of the stack structure 220. A material of the isolating material layer 222 includes silicon oxide/silicon nitride/silicon oxide or silicon nitride/silicon oxide, for example. A method of forming the isolating material layer 222 includes sequentially forming a dielectric layer 224 and a dielectric layer 226 covering each stack structure 220, then removing a portion of the dielectric layer 224 and the dielectric layer 226 to form the isolating material layer 222 on the sidewall of the stack structure 220. A material of the dielectric layer 224 includes silicon nitride, for example, and a material of the dielectric layer 226 includes silicon oxide, for example. A method of forming the dielectric layer 224 and the dielectric layer 226 includes performing a chemical vapor deposition process, for example. A method of removing a portion of the dielectric layer 224 and the dielectric layer 226 includes performing an anisotropic etching process, for example.

Then, a tunneling dielectric layer 228 is formed on the substrate 200 between the stack structures 220. A material of the tunneling dielectric layer 228 includes silicon oxide, for example, and a method of forming the tunneling dielectric layer 228 includes performing a thermal oxidation process, for example.

Figure 2C:
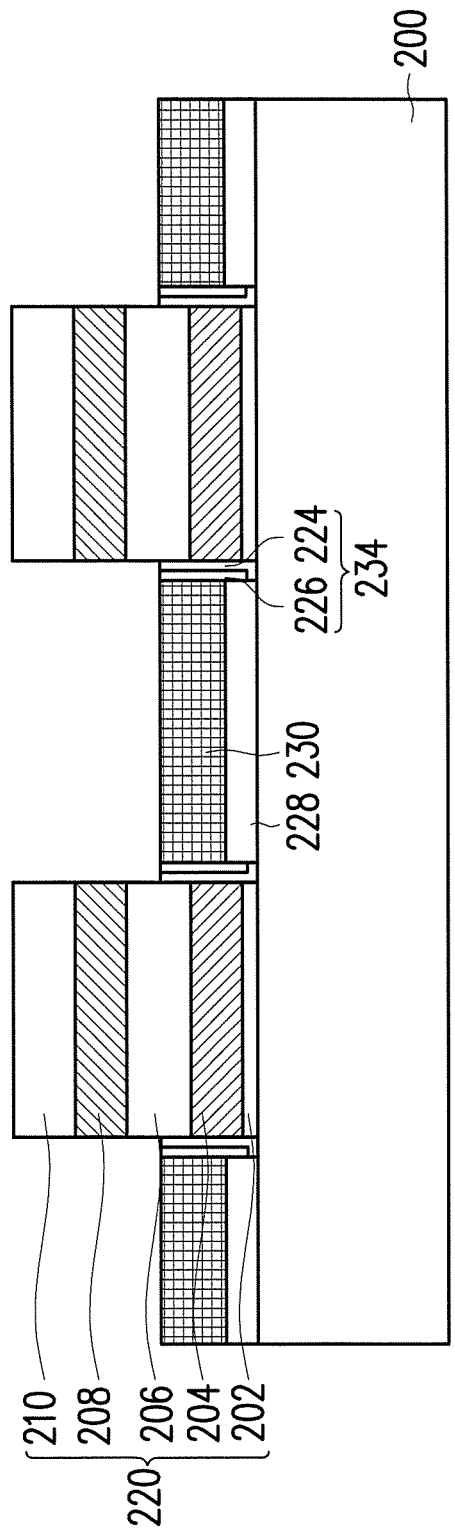

Referring to FIG. 2C, a conductor layer 230 is formed on the tunneling dielectric layer 228 between the stack structures 220. A material of the conductor layer 230 includes doped polysilicon or polysilicides, etc., for example. A method of forming the conductor layer 230 includes forming a conductor material layer (not shown) on the substrate 200 and then removing a portion of the conductor material layer to form the conductor layer 230. A method of forming the conductor material layer includes performing a chemical vapor deposition process, for example. A method of removing a portion of the conductor material layer includes performing chemical-mechanical planarization process (CMP) and then performing an etching back process or an anisotropic etching process, for example.

Then, a portion of the isolating material layer 222 is removed to form an auxiliary gate dielectric layer 234. A method of removing a portion of the isolating material layer 222 includes performing a wet etching process, for example.

Figure 2D:
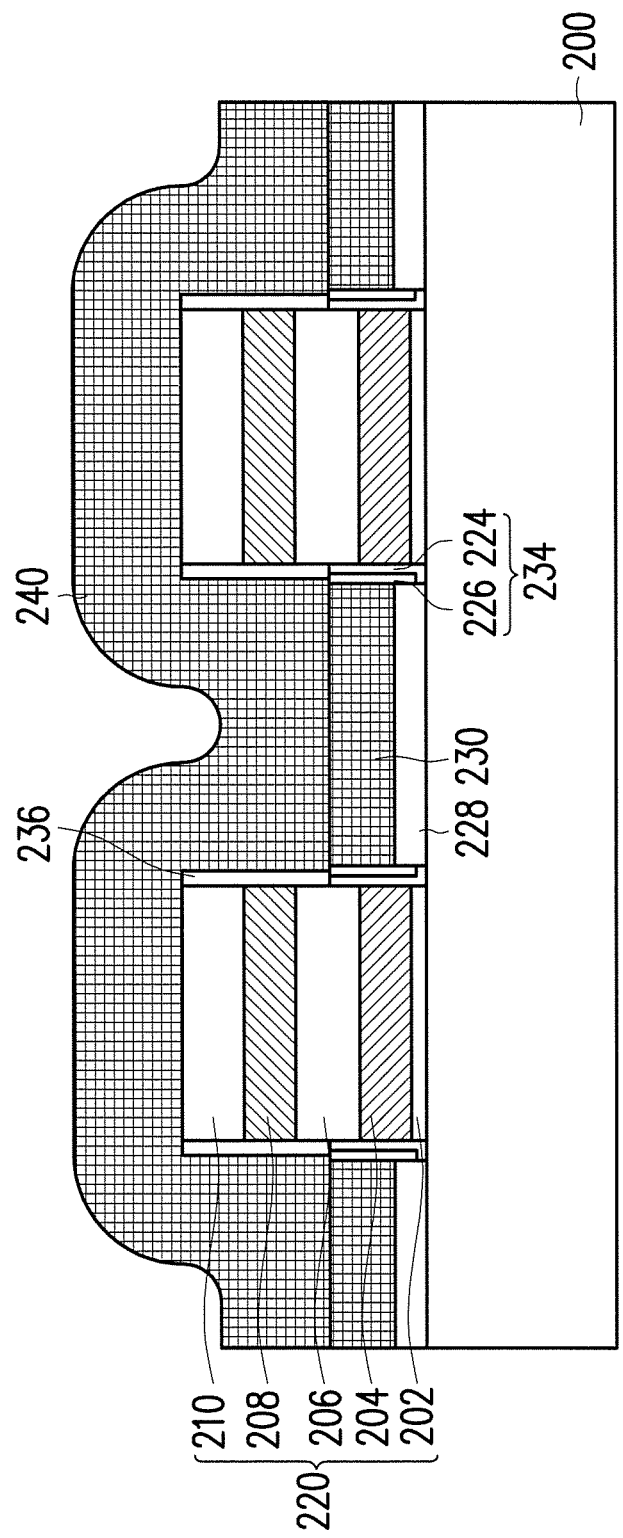

Referring to FIG. 2D, an erase gate dielectric layer 236 is formed on a sidewall of the stack structure 220 and the auxiliary gate dielectric layer 234. A material of the erase gate dielectric layer 236 includes silicon oxide, for example. A method of forming the erase gate dielectric layer 236 includes forming a dielectric layer (not shown) on the substrate, and then removing a portion of the dielectric layer to form the erase gate dielectric layer 236, for example. A method of forming the dielectric layer includes performing a high temperature chemical vapor deposition process, for example. A method of removing a portion of the dielectric layer includes performing an etching back process or an anisotropic etching process, for example.

Then, a conductor layer 240 is formed on the conductor layer 230 between the stack structures 220. A material of the conductor layer 240 includes doped polysilicon or polysilicides, etc., for example. A method of forming the conductor layer 240 includes performing a chemical vapor deposition process, for example.

Figure 2E:
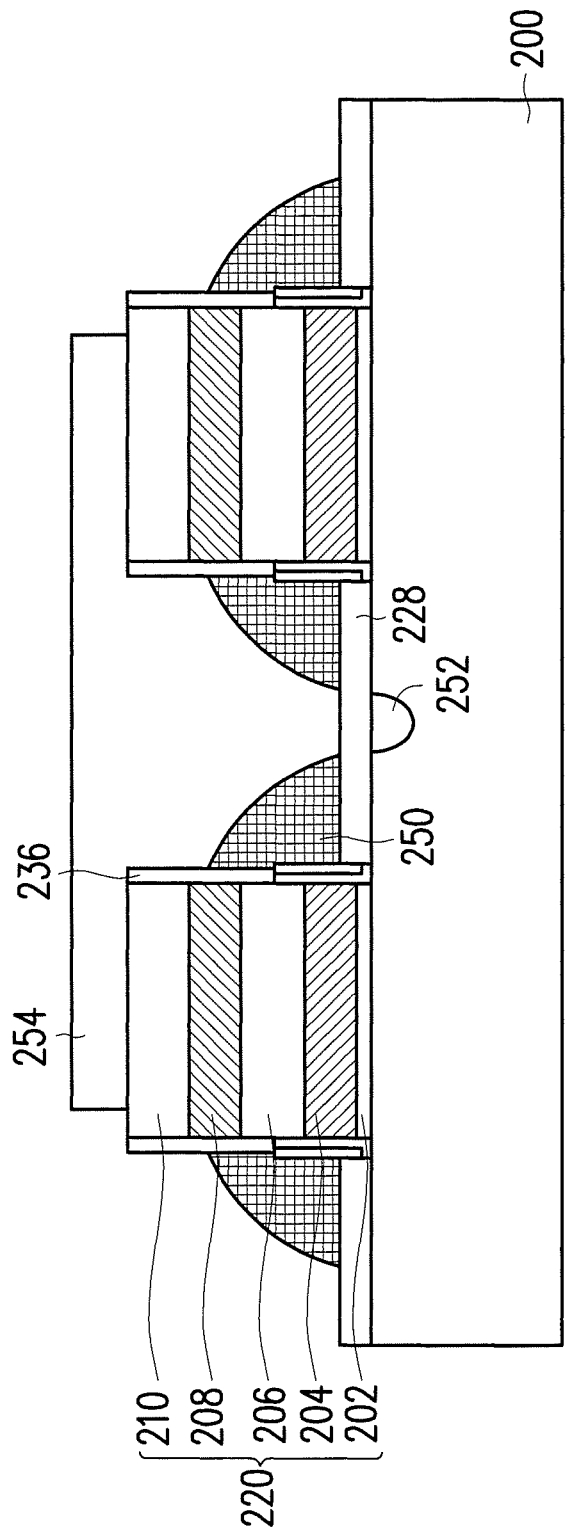

Referring to FIG. 2E, a portion of the conductor 230 and the conductor 240 is removed, so as to form a conductor spacer 250 on the sidewall of the stack structure 220. A method of removing a portion of the conductor layer 230 and the conductor layer 240 includes performing an anisotropic etching process or an etching back process, for example.

Then, a source region 252 is formed in the substrate 200 between the conductor spacers 250. In other words, the source region 252 is formed in the substrate 200 beside the conductor spacer 250 at a first side of the stack structure 220. A method of forming the source region 252 includes performing an ion implantation process by using the conductor spacer 250 at the first side as a mask, for example. An implanted dopant may be an N-type or P-type dopant, depending on a design of the device.

Afterwards, a patterned photoresist layer 254 is formed on the substrate 200. A method of forming the patterned photoresist layer 254 includes forming a photoresist material layer on the whole substrate 200 first and then performing an exposure process and a development process to form the patterned photoresist layer 222, for example.

Figure 2F:
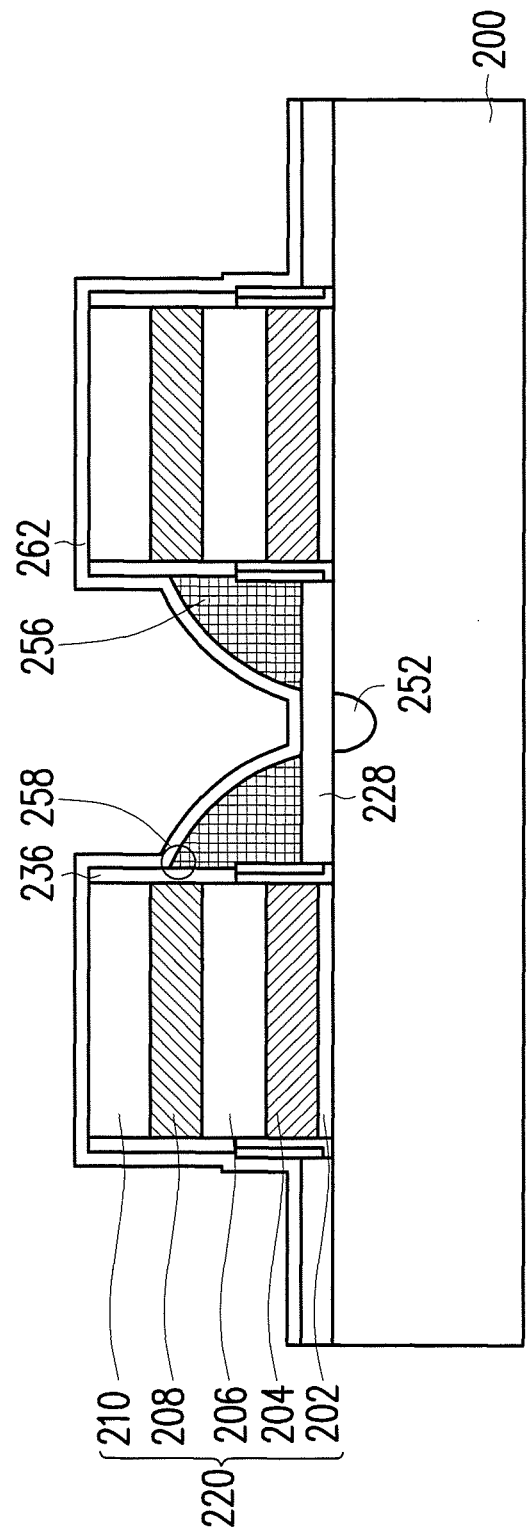

Referring to FIG. 2F, using the patterned photoresist layer 254 as a mask, the conductor spacer 250 at a second side of each stack structure 220 is removed. The second side is opposite to the first side. Meanwhile, the conductor spacer 250 at the first side of the stack structure 220 is patterned to form a floating gate 256. A top portion of the floating gate 256 has a corner portion 258. The corner portion 258 is adjacent to the erase gate 208, and a height of the corner portion 258 falls within a range of a height of the erase gate 208.

Next, the patterned photoresist layer 254 is removed. A method of removing the patterned photoresist layer 254 includes performing a wet photoresist stripping process or a dry photoresist stripping process, for example.

An inter-gate dielectric layer 262 is formed on the substrate 200. The inter-gate dielectric layer 262 covers the floating gate 256. A material of the inter-gate dielectric layer 262 includes silicon oxide/silicon nitride/silicon oxide. A method of forming the inter-gate dielectric layer 262 includes sequentially forming a silicon oxide layer, a silicon nitride layer, and another silicon oxide layer by performing a chemical vapor deposition process, for example. The material of the inter-gate dielectric layer 262 may also include silicon nitride/silicon oxide or other high dielectric constant (e.g., k>4) materials.

Figure 2G:
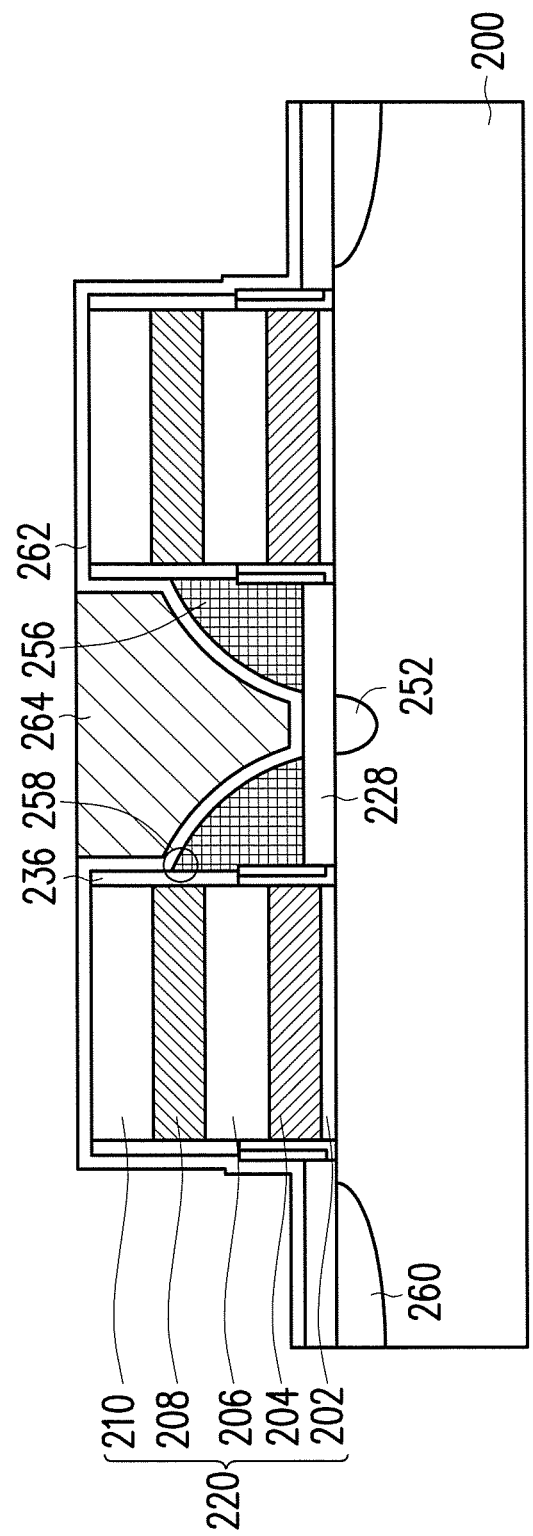

Referring to FIG. 2G, then, a control gate 264 is formed on the inter-gate dielectric layer 262. A material of the control gate 264 includes doped polysilicon or polysilicides, etc., for example. A method of forming the control gate 264 includes forming a conductor material layer (not shown) on the substrate and then patterning the conductor material layer to form the control gate 264. A method of forming the conductor material layer includes performing a chemical vapor deposition process, for example.

Then, a drain region 260 is formed in the substrate 200 beside the second side of the stack structure 220. A method of forming the drain region 260 includes performing an ion implantation process. An implanted dopant may be an N-type or P-type dopant, depending on a design of the device. The dopants and doping concentrations of the source region 252 and the drain region 260 may be the same or different.

Figure 2H:
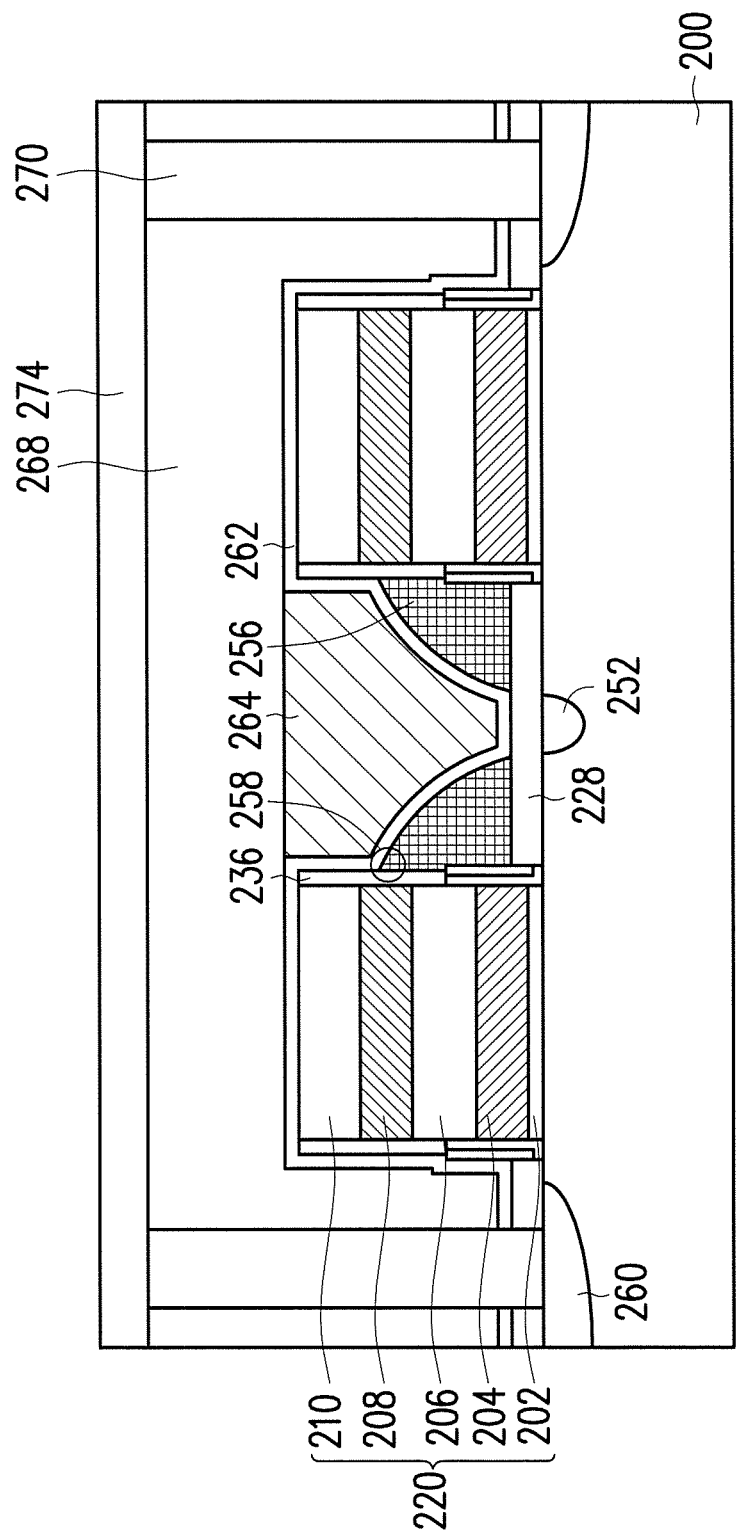

Referring to FIG. 2H, an interlayer insulating layer 268 is formed on the substrate 200. A material for the interlayer insulating layer 268 is silicon oxide, phosphosilicate glass, borophosphosilicate glass or other suitable dielectric materials, for example, and a method of forming the interlayer insulating layer 268 includes performing a chemical vapor deposition process, for example. Then, a plurality of plugs 270 respectively electrically connected to the drain regions 260 are formed in the interlayer insulating layer 268. A material of the plug 270 includes a conductor material such as aluminum, tungsten, etc.

Steps of forming the plug 270 in the interlayer insulating layer 268 are as follows. First of all, a portion of the interlayer insulating layer 268 is removed to form an opening exposing the drain region 260. Then, a conductor material layer (not shown) filling the opening is formed on the substrate 200. Then, a portion of the conductor material layer is removed by performing a chemical mechanical polishing process or an etching back process to expose the interlayer insulating layer 268. A method of forming the opening includes performing a photolithography process, for example.

Then, a bit line 274 is formed on the interlayer insulating layer 268. The bit line 274 is electrically connected to the drain region 260 through the plug 270. A material of the bit line 274 includes a conductor material, such as aluminum, tungsten, copper, etc. A method of forming the bit line 274 includes forming a conductor material layer (not shown) on the substrate 200, and then patterning the conductor material layer to form the bit line 274, for example. A method of forming the conductor material layer includes performing a chemical vapor deposition process, for example.

FIGS. 3A to 3H are cross-sectional schematic views illustrating a manufacturing method of a non-volatile memory according to another embodiment of the invention.

Figure 3A:
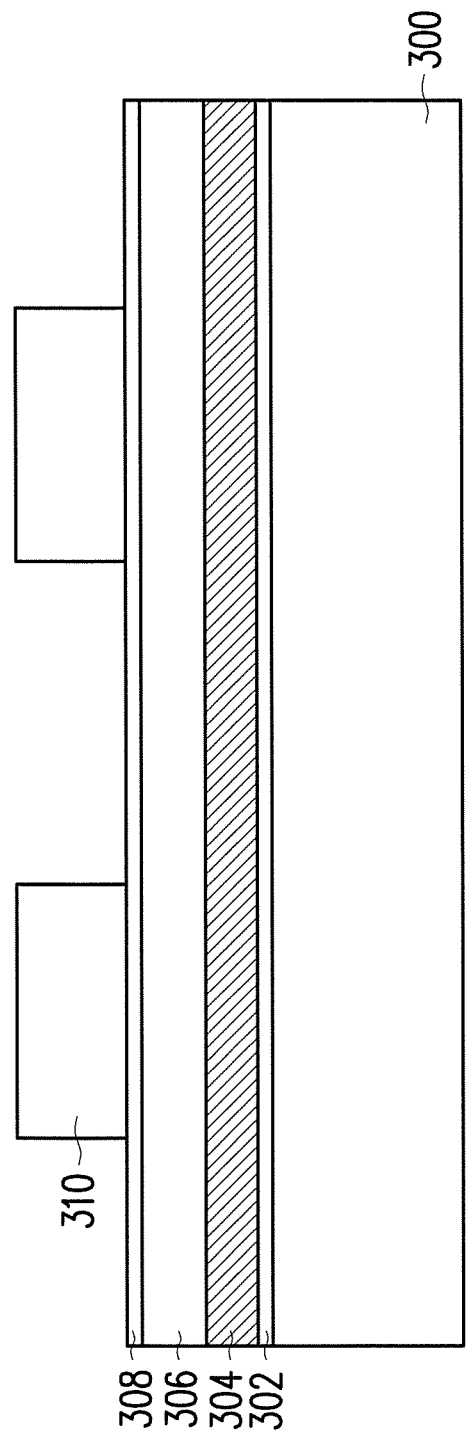
FIGS. 3A to 3H are cross-sectional schematic views illustrating a manufacturing method of a non-volatile memory according to an embodiment of the invention.

First, referring to FIG. 3A, a substrate 300 is provided. Then, a dielectric layer 302, a conductor layer 304, a dielectric layer 306, and a dielectric layer 308 are sequentially formed on the substrate 300. A material of the dielectric layer 302 includes silicon oxide, for example, and a method of forming the dielectric layer 302 includes performing a thermal oxidation process, for example. A material of the conductor layer 304 includes doped polysilicon or polysilicides, etc., for example. When the material of the conductor layer 304 is doped polysilicon, a method of forming the conductor layer 304 includes forming an undoped polysilicon layer by performing a chemical vapor deposition process and then performing an ion implantation process, or implanting dopants in-situ by performing a chemical vapor deposition process, for example. A material of the dielectric layer 306 includes silicon oxide, for example, and a method of forming the dielectric layer 306 includes performing a chemical vapor deposition process, for example. A material of the dielectric layer 308 includes silicon nitride, for example, and a method of forming the dielectric layer 308 includes performing a chemical vapor deposition process, for example.

Then, a patterned photoresist layer 310 is formed on the substrate 300. A method of forming the patterned photoresist layer 310 includes forming a photoresist material layer on the whole substrate 300 and then performing an exposure process and a development process to form the patterned photoresist layer 310, for example.

Figure 3B:
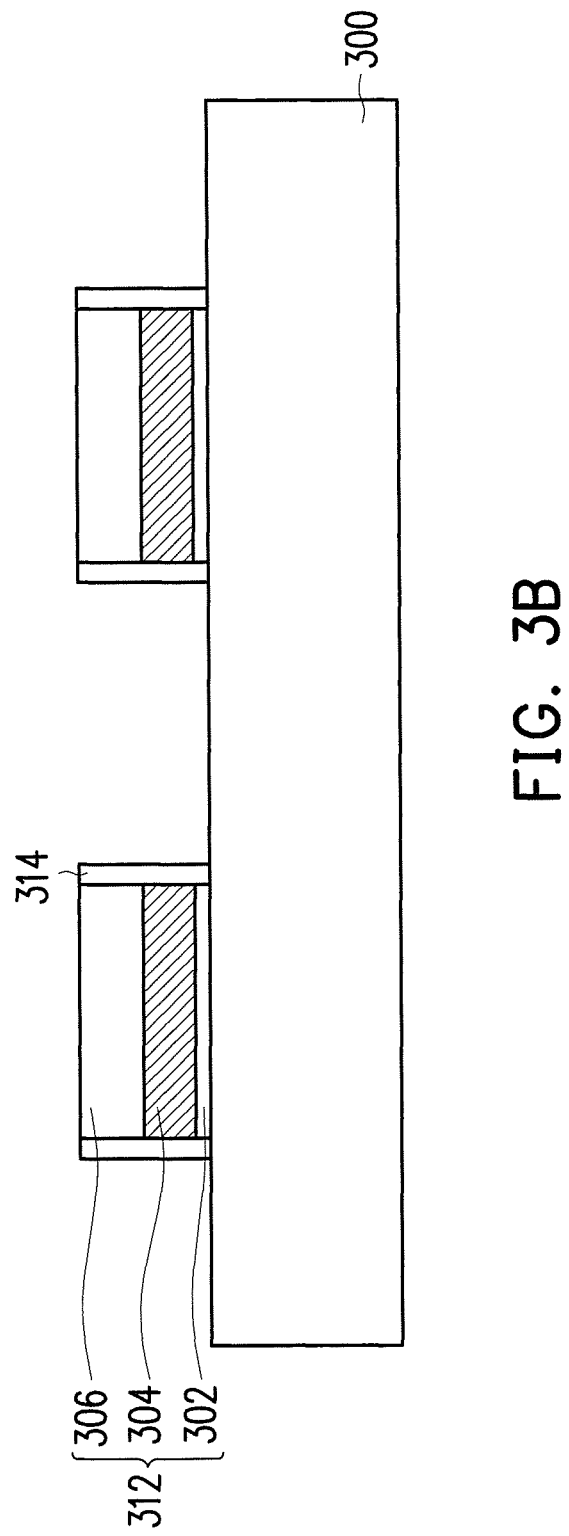

Referring to FIG. 3B, using the patterned photoresist layer 310 as a mask, a portion of the dielectric layer 308, the dielectric layer 306, the conductor layer 304, and the dielectric layer 302 is removed to form at least two auxiliary gate structures 312. The dielectric layer 302 serves as a gate dielectric layer, the conductor layer 304 serves as an auxiliary gate (word line), and the dielectric layer 306 serves as an insulating layer. Next, the patterned photoresist layer 310 is removed. A method of removing the patterned photoresist layer 310 includes performing a wet photoresist stripping process or a dry photoresist stripping process, for example.

Then, an auxiliary gate dielectric layer 314 is formed on a sidewall of the auxiliary gate structure 312. A material of the auxiliary gate dielectric layer 314 includes silicon oxide/silicon nitride/silicon oxide or silicon nitride/silicon oxide, for example. A method of forming the auxiliary gate dielectric layer 314 includes forming a dielectric layer (not shown) covering each auxiliary gate structure 312 on the substrate 300, and then removing a portion of the dielectric layer to form the auxiliary gate dielectric layer 314. A method of forming the dielectric layer includes performing a chemical vapor deposition process, for example. A method of removing a portion of the dielectric layer includes performing an anisotropic etching process, for example.

Figure 3C:
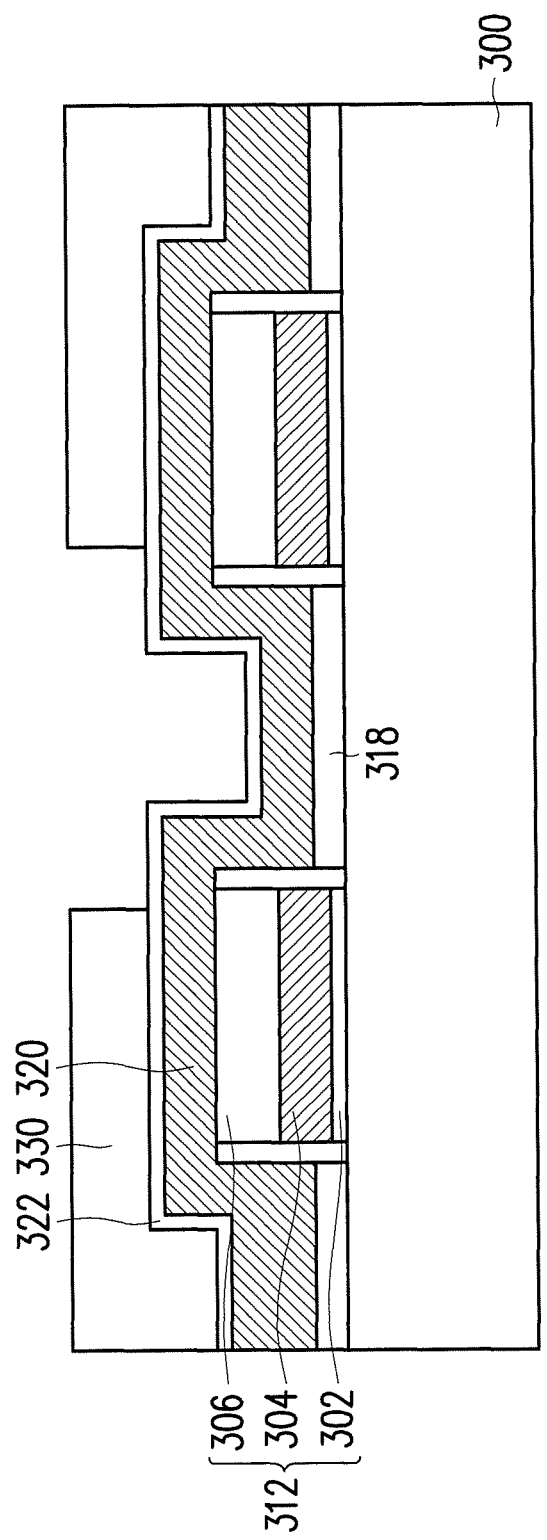

Referring to FIG. 3C, a tunneling dielectric layer 318 is formed on the substrate 300 between the auxiliary gate structures 312. A material of the tunneling dielectric layer 318 includes silicon oxide, for example, and a method of forming the tunneling dielectric layer 318 includes performing a thermal oxidation process, for example.

Then, a conductor layer 320 is formed on the substrate 300. A material of the conductor layer 320 includes doped polysilicon or polysilicides, etc., for example. When the material of the conductor layer 320 is doped polysilicon, a method of forming the conductor layer 320 includes forming an undoped polysilicon layer by performing a chemical vapor deposition process and then performing an ion implantation process, or implanting dopants in-situ by performing a chemical vapor deposition process, for example.

Then, a dielectric layer 322 is formed on the substrate 300. A material of the dielectric layer 322 includes silicon oxide, for example, and a method of forming the dielectric layer 322 includes performing a chemical vapor deposition process, for example. Next, a patterned photoresist layer 330 is formed on the substrate 300. A method of forming the patterned photoresist layer 330 includes forming a photoresist material layer on the whole substrate 300 first, and then performing an exposure process and a development process to form the patterned photoresist layer 330, for example.

Figure 3D:
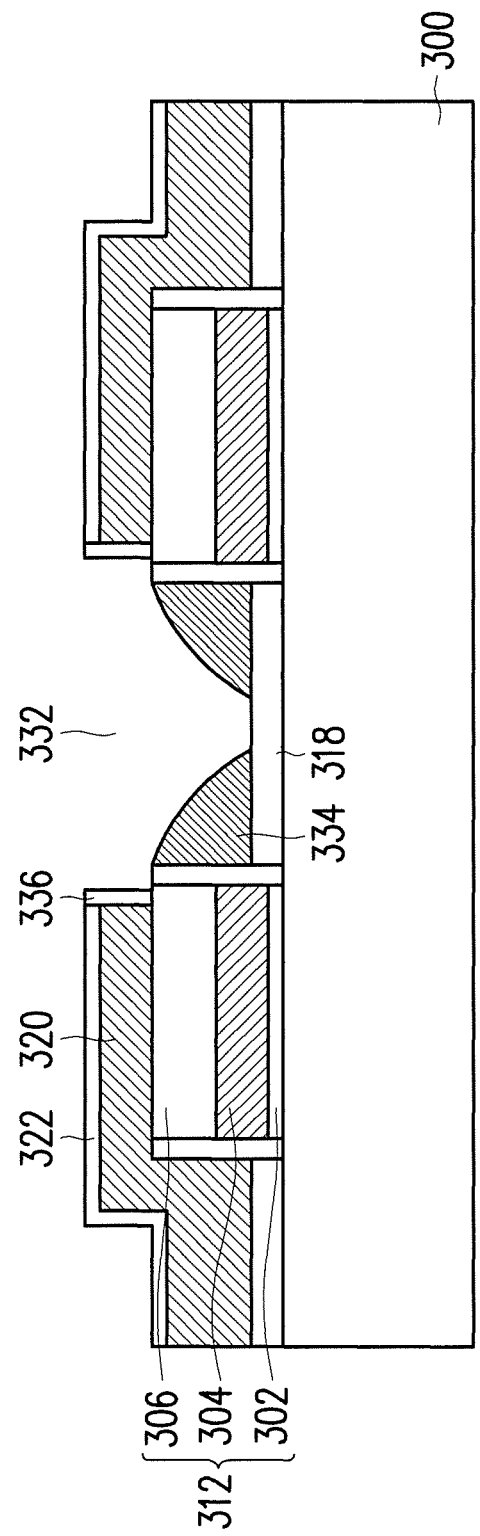

Referring to FIG. 3D, using the patterned photoresist layer 330 as a mask, a portion of the dielectric layer 322 and the conductor layer 320 is removed to form an opening 332 at least exposing the tunneling dielectric layer 318 between the auxiliary gate structures 312.

Then, a first conductor spacer 334 is formed on a sidewall at a first side of the auxiliary gate structure 312. A method of forming the first conductor spacer 334 includes removing a portion of the conductor layer 320 to form the first conductor spacer 334, for example. A method of removing a portion of the conductor layer 320 includes performing an anisotropic etching process or an etching back process, for example. Next, the patterned photoresist layer 330 is removed. A method of removing the patterned photoresist layer 330 includes performing a wet photoresist stripping process or a dry photoresist stripping process, for example.

Then, an erase gate dielectric layer 336 is formed on a sidewall of the conductor layer 320 exposed by the opening 332. A material of the erase gate dielectric layer 336 includes silicon oxide, for example, and a method of forming the erase gate dielectric layer 336 includes forming a dielectric layer (not shown) on the substrate and then removing a portion of the dielectric layer to form the erase gate dielectric layer 336. A method of forming the dielectric layer includes performing a high temperature chemical vapor deposition process, for example. A method of removing a portion of the dielectric layer includes performing an anisotropic etching process, for example.

Figure 3E:
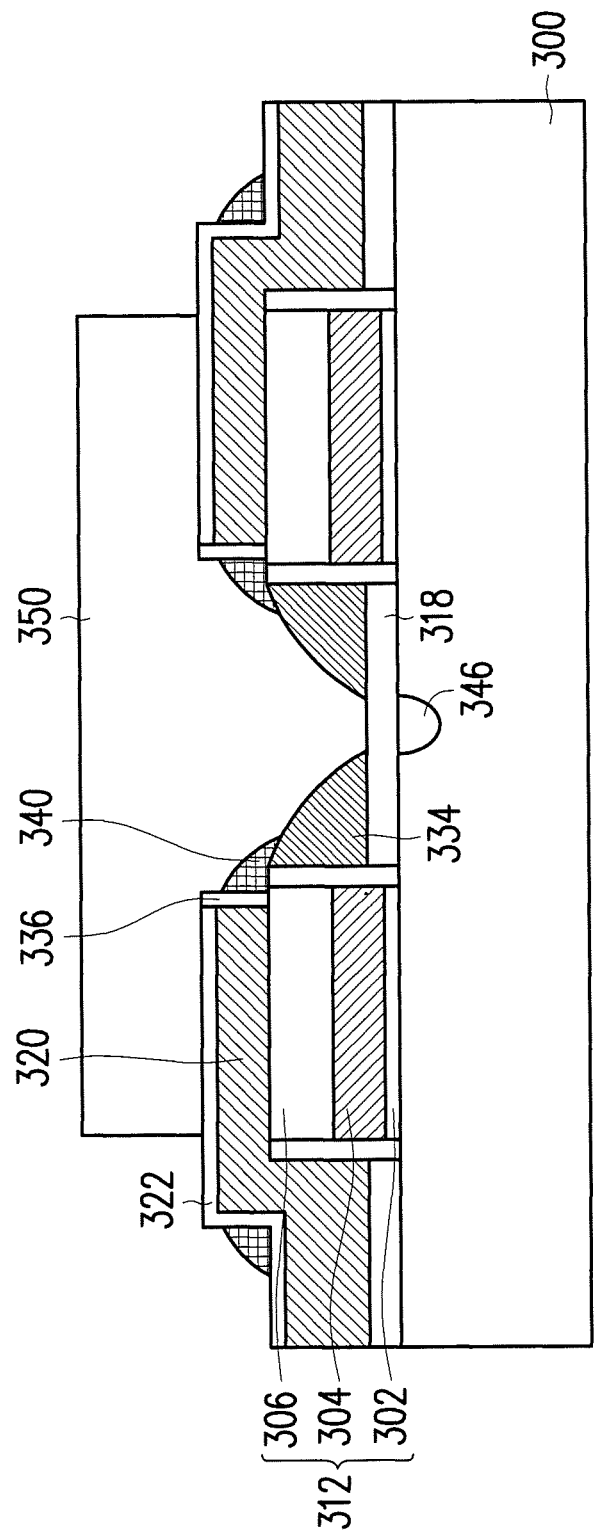

Referring to FIG. 3E, a second conductor spacer 340 is formed on the first conductor spacer 334 and beside the erase gate dielectric layer 336. A material of the second conductor spacer 340 includes doped polysilicon or polysilicides, for example. A method of forming the second conductor spacer 340 includes forming a conductor material layer (not shown) on the substrate, and then removing a portion of the conductor material layer to form the second conductor spacer 340, for example. A method of forming the conductor material layer includes performing a chemical vapor deposition process, for example. A method of removing a portion of the conductor material layer includes performing an anisotropic etching process or etching back process, for example.

Then, a source region 346 is formed in the substrate 300 between the first conductor spacers 334. A method of forming the source region 346 includes performing an ion implantation process by using the first conductor spacer 334 and the second conductor spacer 340 on the first side as a mask, for example. An implanted dopant may be an N-type or P-type dopant, depending on a design of the device.

Then, a patterned photoresist layer 350 is formed on the substrate 300. A method of forming the patterned photoresist layer 350 includes forming a photoresist material layer on the whole substrate 300 and then performing an exposure process and a development process to form the patterned photoresist layer 350, for example.

Figure 3F:
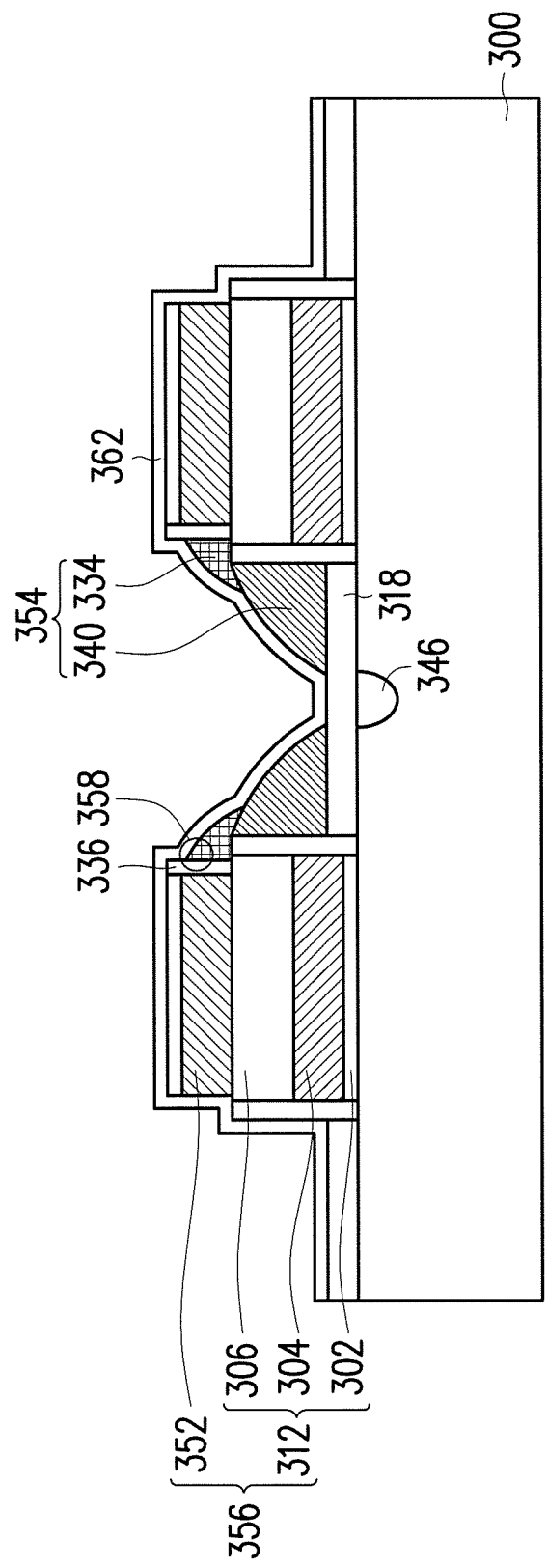

Referring to FIG. 3F, using the patterned photoresist layer 350 as a mask, the second conductor spacer 340 and a portion of the dielectric layer 322 and the conductor layer 320 at a second side of the auxiliary gate structure 312 are removed to form an erase gate 352, and the second conductor spacer 340 and the first conductor spacer 334 are patterned to form a floating gate 354 on the first side of the auxiliary gate structure 312. In addition, the second side is opposite to the first side. A top portion of the floating gate 354 has a corner portion 358. The corner portion 358 is adjacent to the erase gate 352, and a height of the corner portion 358 falls within a range of a height of the erase gate 352. Besides, the auxiliary gate structure 312 and the erase gate 352 form a stack structure 356. Next, the patterned photoresist layer 350 is removed. A method of removing the patterned photoresist layer 350 includes performing a wet photoresist stripping process or a dry photoresist stripping process, for example.

Figure 3G:
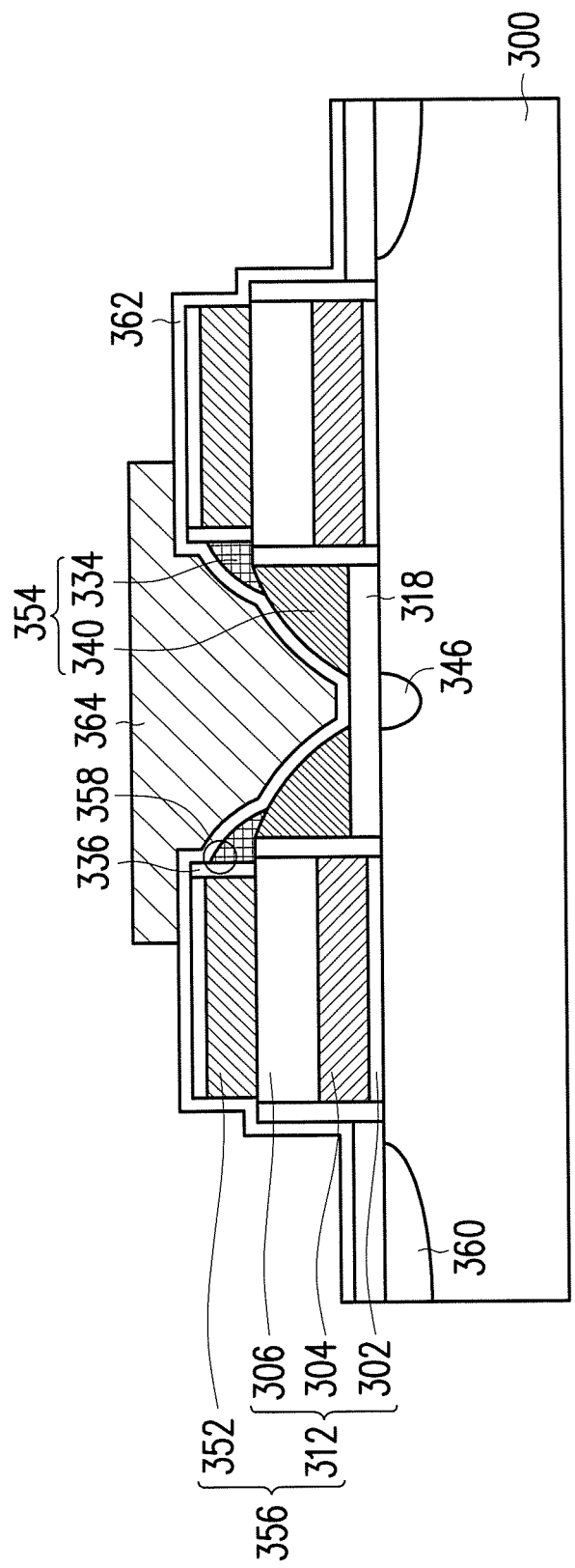

Referring to FIG. 3G, an inter-gate dielectric layer 362 is formed on the substrate 300. The inter-gate dielectric layer 362 covers the floating gate 354. A material of the inter-gate dielectric layer 362 includes silicon oxide/silicon nitride/silicon oxide. A method of forming the inter-gate dielectric layer 362 includes sequentially forming a silicon oxide layer, a silicon nitride layer, and another silicon oxide layer by performing a chemical vapor deposition process, for example. The material of the inter-gate dielectric layer 362 may also include silicon nitride/silicon oxide or other high dielectric constant (e.g., k>4) materials.

Then, a control gate 364 is formed on the inter-gate dielectric layer 362. A material of the control gate 364 includes doped polysilicon or polysilicides, etc., for example. A method of forming the control gate 364 includes forming a conductor material layer (not shown) on the substrate 300 and then patterning the conductor material layer to form the control gate 364. A method of forming the conductor material layer includes performing a chemical vapor deposition process, for example.

Then, a drain region 360 is formed in the substrate 300 on the second side of the stack structure 356. A method of forming the drain region 360 includes performing an ion implantation process. An implanted dopant may be an N-type or P-type dopant, depending on a design of the device. The dopants and doping concentrations of the source region 346 and the drain region 360 may be the same or different.

Figure 3H:
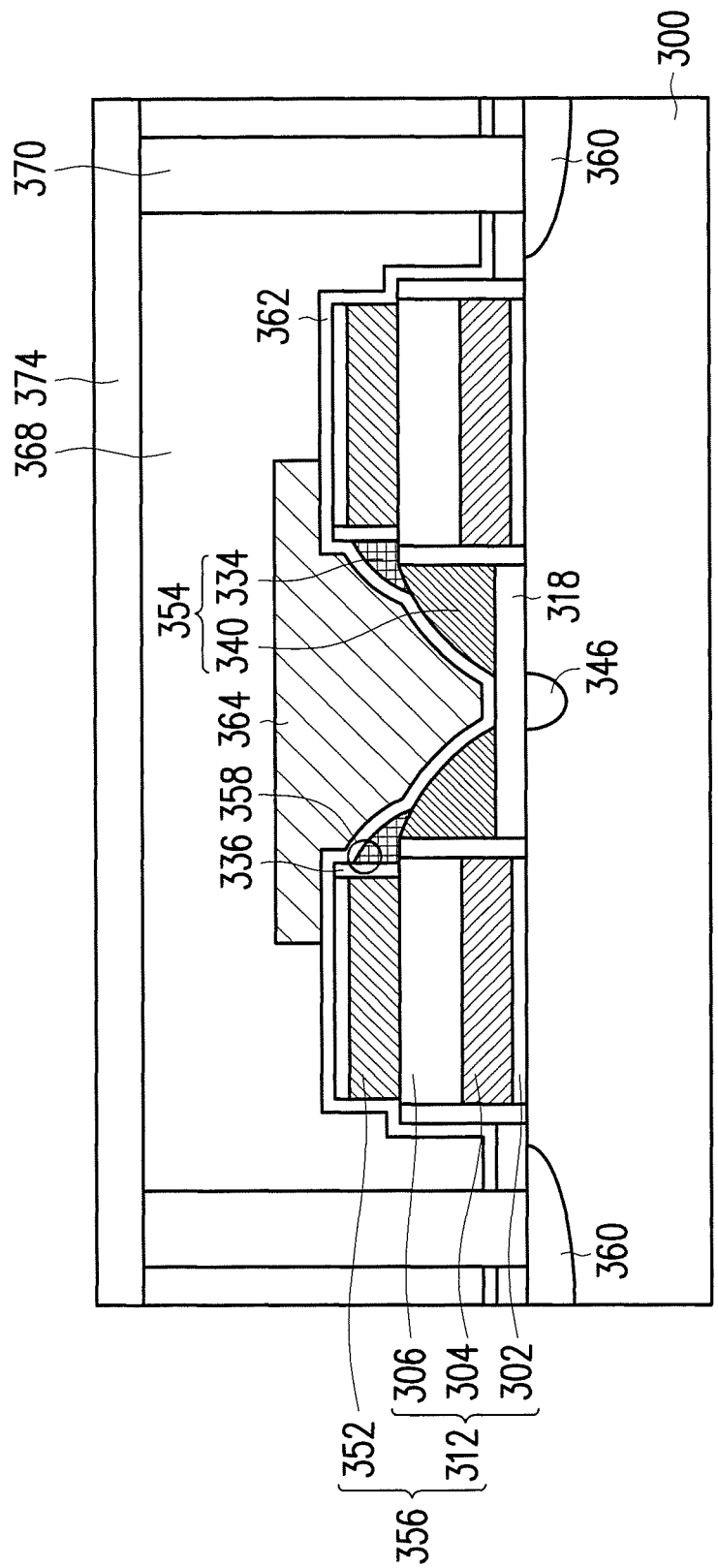

Referring to FIG. 3H, an interlayer insulating layer 368 is formed on the substrate 300. A material for the interlayer insulating layer 368 is silicon oxide, phosphosilicate glass, borophosphosilicate glass or other suitable dielectric materials, for example, and a method of forming the interlayer insulating layer 368 includes performing a chemical vapor deposition process, for example. Then, a plurality of plugs 370 respectively electrically connected to the drain regions 360 are formed in the interlayer insulating layer 368. A material of the plug 370 includes a conductor material such as aluminum, tungsten, etc.

Steps of forming the plug 370 in the interlayer insulating layer 368 are as follows. First of all, a portion of the interlayer insulating layer 368 is removed to form a plurality of openings respectively exposing the drain regions 360. Then, a conductor material layer (not shown) filling the openings is formed on the substrate 300. Then, a portion of the conductor material layer is removed by performing a chemical mechanical polishing process or an etching back process to expose the interlayer insulating layer 368. A method of forming the opening includes performing a photolithography process, for example.

Then, a bit line 374 is formed on the interlayer insulating layer 368. The bit line 374 is electrically connected to the drain region 360 through the plug 370. A material of the bit line 374 includes a conductor material, such as aluminum, tungsten, copper, etc. A method of forming the bit line 374 includes forming a conductor material layer (not shown) on the substrate 300, and then patterning the conductor material layer to form the bit line 374. A method of forming the conductor material layer includes performing a chemical vapor deposition process, for example.

In the manufacturing method of the non-volatile memory of the invention, two adjacent memory cells in X direction (row direction) have the same structure and in a mirror arrangement, and share the source region or drain region and share the control gate. Two adjacent memory cells in Y direction (column direction) have the same structure and share the source region, the gate dielectric layer, the auxiliary gate (word line), the insulating layer, the erase gate, and the control gate. In this way, the integrity of the device may be increased.

The auxiliary gate and the erase gate formed in the manufacturing method of the non-volatile memory of the invention constitute a stack structure. Thus, the integrity of the device may be increased.

In the manufacturing method of the non-volatile memory, the gate dielectric layer formed below the auxiliary gate has a thinner thickness. When operating the memory cells, the channel region below the auxiliary gate may be turned on/off by using a smaller voltage. Namely, the operational voltage is reduced. The control gate formed accordingly covers the floating gate, so as to increase an area included between the control gate and the floating gate, thereby increasing the coupling ratio of the memory device. Since the corner portion is formed in the floating gate within the height of the erase gate, and an angle of the corner portion is less than or equal to 90 degrees, by concentrating an electrical field by using the corner portion, the erase voltage may be reduced to effectively pull out electrons from the floating gate and increase the speed of erasing data.

Figure 4A:
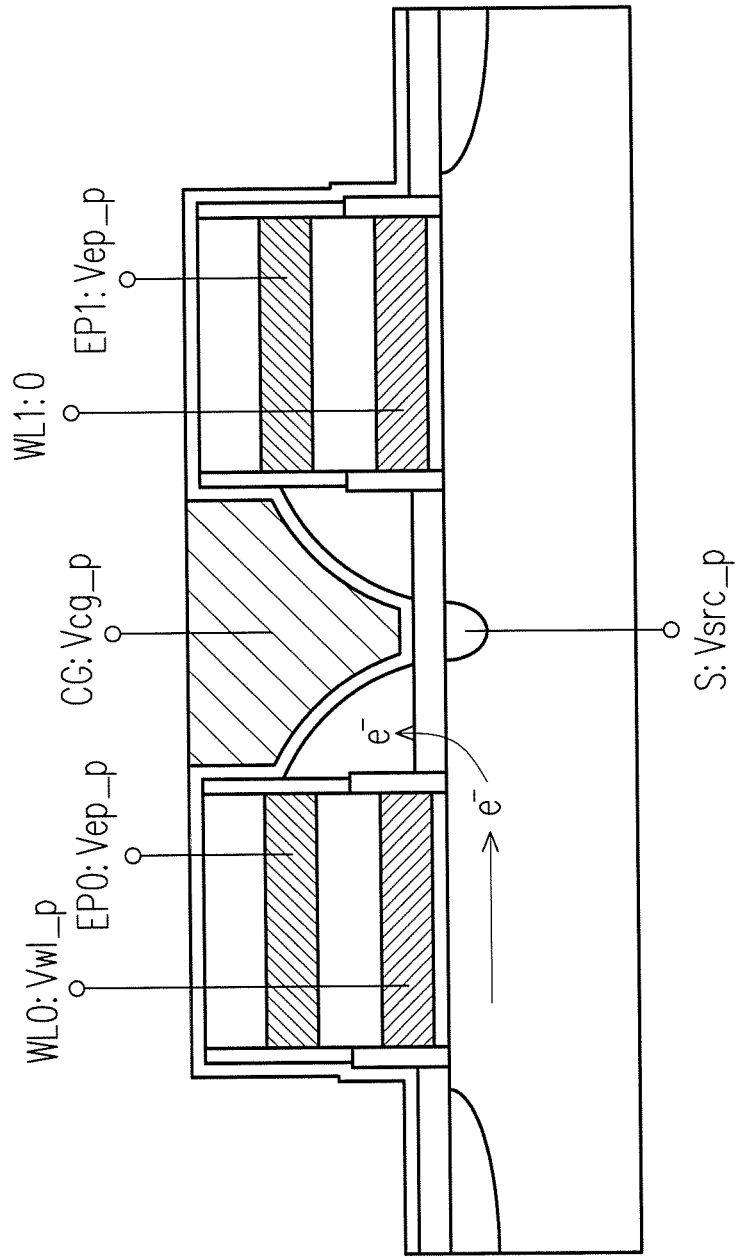
FIG. 4A is a schematic view illustrating performing a programming operation to a memory cell according to an example.
Figure 4B:
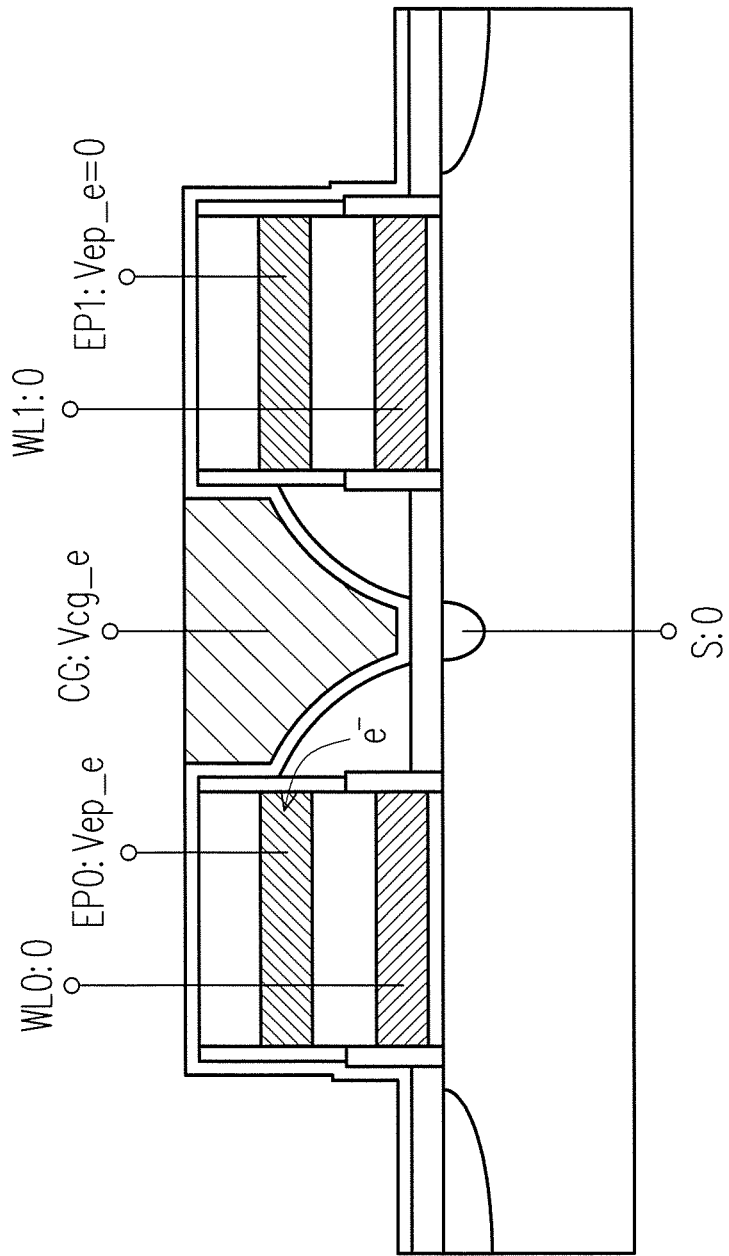
FIG. 4B is a schematic view illustrating performing an erasing operation to a memory cell according to an example.
Figure 4C:
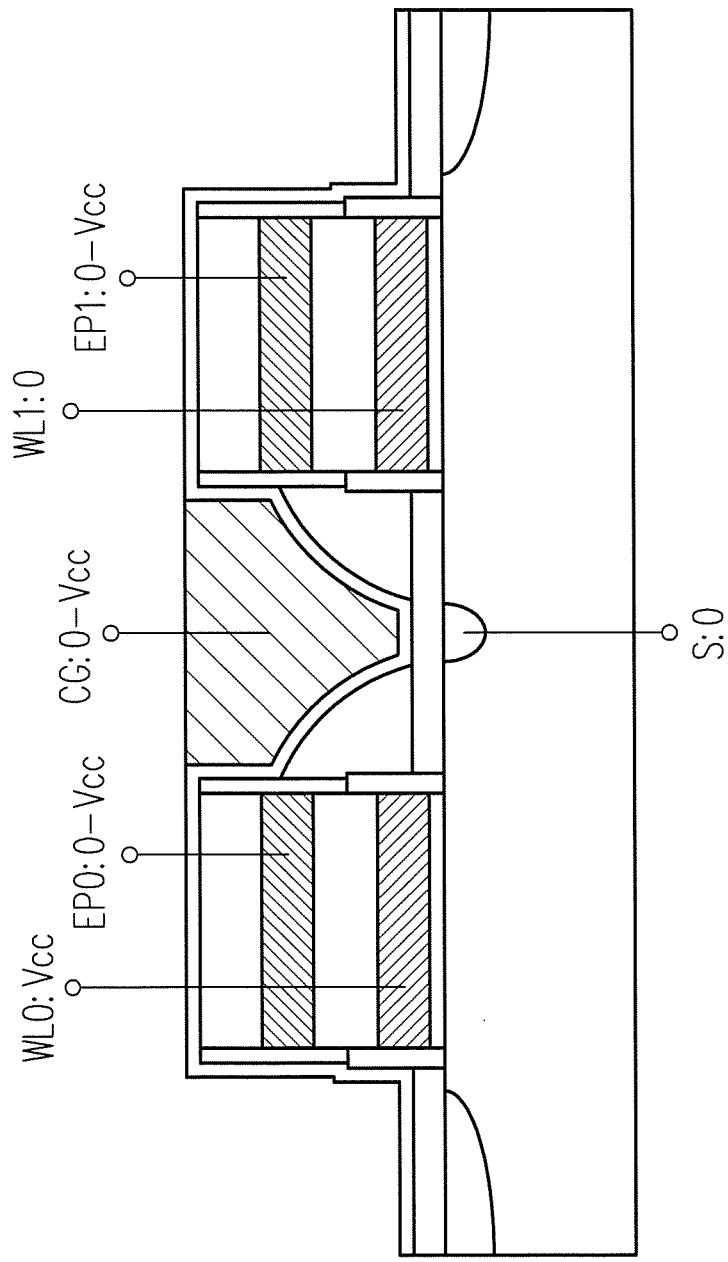
FIG. 4C is a schematic view illustrating performing a reading operation to a memory cell according to an example.

In the following, operation modes of the non-volatile memory of the invention, including operation modes of programming, erasing, and reading of data, are described in the following. FIG. 4A is a schematic view illustrating performing a programming operation to a memory cell according to an example. FIG. 4B is a schematic view illustrating performing an erasing operation to a memory cell according to an example. FIG. 4C is a schematic view illustrating performing a reading operation to a memory cell according to an example.

Referring to FIG. 4A, when the programming operation is performed, a voltage $Vwl\_p$ is applied at an auxiliary gate WL0 of a chosen memory cell, so as to form a channel in the substrate below the auxiliary gate. Here, the voltage $Vwl\_p$ is in a range from 0.6 V to 1.2 V, for example. A voltage of 0 V is applied to an auxiliary gate WL1 of a non-chosen memory cell. A voltage $Vsrc\_p$ is applied to a source region S, a voltage $Vcg\_p$ is applied to a control gate CG, and a voltage $Vep\_p$ is applied respectively to control gates EP0 of the chosen memory cell and EP1 of the non-chosen memory cell. The voltage $Vsrc\_p$ is in a range from 3 V to 7 V, for example, the voltage $Vcg\_p$ is in a range from 5 V to 9 V, for example, and the voltage $Vep\_p$ is in a range from 3 V to 7 V, for example. Under such bias voltage, electrons are moved from the drain region to the source region and injected into a floating gate FG0 of the chosen memory cell through a source side hot electron injection mode. Since the voltage of 0 V is applied to the auxiliary gate WL1 of the non-chosen memory cell, a channel region is unable to be formed, and the electrons are unable to be injected into a floating gate FG1 of the non-chosen memory cell. Thus, the non-chosen memory cell is not programmed.

Referring to FIG. 4B, when the erasing operation is performed, a voltage Vcg-e is applied to the control gate CG, and a voltage Vep_e is applied to the erase gate EP0 of the chosen memory cell and a voltage of 0 V is applied to the erase gate EP1 of the non-chosen memory cell. The voltage Vep_e is in a range from 6 V to 12 V, for example, and the voltage Vcg_e is in a range from −8 V to 0 V, for example. By using a voltage difference between the control gate CG and the erase gate EP0, a FN tunneling effect is induced to pull out and remove electrons stored in the floating gate FG0 of the memory cell.

Referring to FIG. 4C, when the reading operation is performed, a voltage Vcc is applied to the auxiliary gate WL0 of the chosen memory cell, a voltage of 0-Vcc is applied to the control gate CG, a voltage of 0-Vcc is applied to the erase gate EP0 of the chosen memory cell, and a voltage of 0-Vcc is applied to the erase gate EP1 of the non-chosen memory cell. Here, the voltage Vcc is a power voltage, for example. Under such bias voltage, digital data stored in the memory cells may be determined by detecting a current in a channel of the memory cell.

In an operation method of the non-volatile memory of the invention, when the programming operation is performed, a low voltage is applied to the auxiliary gate to form a channel in the substrate below the auxiliary gate, so as to write the electrons into the floating gate through the source side hot electron injection mode. When the erasing operation is performed, by using the erase gate to erase data, the electrons are removed through the erase gate dielectric layer. In this way, the number of times that the electrons pass through the tunneling dielectric layer is reduced, and a reliability is thus improved. In addition, since the corner portion of the floating gate is disposed within the height of the erase gate, and the angle of the corner portion is less than or equal to 90 degrees, by concentrating the electrical field by using the corner portion, the electrons may be effectively pulled out from the floating gate, and the speed of erasing data is increased.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A non-volatile memory, comprising:
   a first memory cell, disposed on a substrate, wherein the first memory cell comprises:
   a stack structure, comprising a gate dielectric layer, an auxiliary gate, an insulating layer, and an erase gate sequentially disposed on the substrate, wherein a width of the erase gate is the same as a width of the auxiliary gate;
   a floating gate, disposed on a sidewall on a first side of the stack structure, wherein a top portion of the floating gate has a corner portion, the corner portion is adjacent to the erase gate, and a height of the corner portion falls within a range of a height of the erase gate;
   a tunneling dielectric layer, disposed between the floating gate and the substrate;
   an erase gate dielectric layer, disposed between the erase gate and the floating gate;
   an auxiliary gate dielectric layer, disposed between the auxiliary gate and the floating gate;
   a source region and a drain region, respectively disposed in the substrate at sides of the stack structure and the floating gate, wherein the source region is adjacent to the floating gate, the drain region is adjacent to a second side of the stack structure, and the first side is opposite to the second side;
   a control gate, disposed on the source region and the floating gate; and
   an inter-gate dielectric layer, disposed between the control gate and the floating gate, wherein the erase gate and the control gate are separated from each other.

2. The non-volatile memory as claimed in claim 1, further comprising:
   a second memory cell, disposed on the substrate, wherein a structure of the second memory cell is the same as a structure of the first memory cell, and the second memory cell and the first memory cell are disposed in a mirror arrangement and share the source region or the drain region.

3. The non-volatile memory as claimed in claim 2, wherein the first memory cell and the second memory cell share the control gate, and the control gate fills an opening between the first memory cell and the second memory cell.

4. The non-volatile memory as claimed in claim 1, wherein the auxiliary gate, the erase gate and the control gate extend along a first direction, and the non-volatile memory further comprises:
   a third memory cell, disposed on the substrate, wherein a structure of the third memory cell is the same as a structure of the first memory cell, the third memory cell and the first memory cell share the source region, the auxiliary gate, the erase gate, and the control gate, and the control gate fills between the first memory cell and the third memory cell in the first direction.

5. The non-volatile memory as claimed in claim 1, wherein the tunneling dielectric layer is disposed between the control gate and the source region.

6. The non-volatile memory as claimed in claim 1, wherein a thickness of the auxiliary gate dielectric layer is greater than or equal to a thickness of the erase gate dielectric layer.

7. The non-volatile memory as claimed in claim 1, wherein a material of the auxiliary gate dielectric layer comprises silicon oxide/silicon nitride, silicon oxide/silicon nitride/silicon oxide, or silicon oxide.

8. The non-volatile memory as claimed in claim 1, wherein a material of the insulating layer comprises silicon oxide.

9. The non-volatile memory as claimed in claim 1, wherein a material of the inter-gate dielectric layer comprises silicon oxide/silicon nitride/silicon oxide, silicon nitride/silicon oxide, or other high dielectric constant (k>4) materials.

10. The non-volatile memory as claimed in claim 1, wherein a material of the tunneling dielectric layer comprises silicon oxide, and a thickness of the tunneling dielectric layer is in a range from 60 Å to 200 Å.

11. The non-volatile memory as claimed in claim 1, wherein a material of the gate dielectric layer comprises silicon oxide, and a thickness of the gate dielectric layer is less than or equal to a thickness of the tunneling dielectric layer.

12. The non-volatile memory as claimed in claim 1, wherein a material of the erase gate dielectric layer comprises silicon oxide, and a thickness of the erase gate dielectric layer is in a range from 100 Å to 180 Å.

13. The non-volatile memory as claimed in claim 1, wherein a top portion of the floating gate has a corner portion, and an angle of the corner portion is less than or equal to 90 degrees.

14. The non-volatile memory as claimed in claim 1, wherein a width of the auxiliary gate is greater than a width of the erase gate, and a stepped profile is formed at the first side of the stack structure.

15. The non-volatile memory as claimed in claim 14, wherein the floating gate comprises a first portion located at a sidewall of the auxiliary gate and a second portion located at a sidewall of the erase gate.

\* \* \* \* \*